(12) United States Patent
Miyauchi et al.

(10) Patent No.: US 9,656,353 B2
(45) Date of Patent: May 23, 2017

(54) REFLOW FILM, SOLDER BUMP FORMATION METHOD, SOLDER JOINT FORMATION METHOD, AND SEMICONDUCTOR DEVICE

(71) Applicant: Hitachi Chemical Company, Ltd., Tokyo (JP)

(72) Inventors: Kazuhiro Miyauchi, Tsukuba (JP); Naoya Suzuki, Tsukuba (JP); Nozomu Takano, Yuuki (JP); Yukihiko Yamashita, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/353,495

(22) PCT Filed: Oct. 26, 2012

(86) PCT No.: PCT/JP2012/077759
§ 371 (c)(1),
(2) Date: Apr. 23, 2014

(87) PCT Pub. No.: WO2013/062095
PCT Pub. Date: May 2, 2013

(65) Prior Publication Data
US 2014/0252607 A1  Sep. 11, 2014

(30) Foreign Application Priority Data

Oct. 26, 2011  (JP) .................. 2011-235479
Oct. 26, 2011  (JP) .................. 2011-235484
Oct. 26, 2011  (JP) .................. 2011-235489

(51) Int. Cl.
*H01L 23/00* (2006.01)
*H01L 23/498* (2006.01)
(Continued)

(52) U.S. Cl.
CPC .......... *B23K 35/362* (2013.01); *B23K 1/0016* (2013.01); *B23K 1/012* (2013.01);
(Continued)

(58) Field of Classification Search
CPC ... H01L 23/49811; H01L 24/26; H01L 21/60; H01L 21/563; B23K 35/362
(Continued)

(56) References Cited

U.S. PATENT DOCUMENTS 5,591,037 A * 1/1997 Jin et al. ................ 439/91
2004/0260020 A1* 12/2004 Miyake et al. ........... 525/61
(Continued)

FOREIGN PATENT DOCUMENTS

CN  101536185 A  9/2009
JP  8-274454 A  10/1996
(Continued)

OTHER PUBLICATIONS

International Preliminary Report on Patentability of Appln. No. PCT/JP2012/077759 dated May 8, 2014 in English.
(Continued)

*Primary Examiner* — Christine Enad
(74) *Attorney, Agent, or Firm* — Fitch, Even, Tabin & Flannery, LLP

(57) ABSTRACT

The present invention relates to a reflow film containing a thermoplastic resin which is dissolvable in a solvent, and solder particles, wherein the solder particles are dispersed in the film, and also relates to a solder bump formation method which comprises: (A) a step of mounting the reflow film on the electrode surface side of a substrate, (B) a step of mounting and fixing a flat plate, (C) a step of heating, and (D) a step of dissolving and removing the reflow film, and herewith, a reflow film is provided which, by causing localization of the solder component on the electrodes of the
(Continued)

substrate by self-assembly, exhibits excellent storage properties, transportability and handling properties during use, and can form solder bumps or solder joints selectively on only the electrodes.

32 Claims, 7 Drawing Sheets

(51) Int. Cl.
  B23K 35/362 (2006.01)
  B23K 35/26 (2006.01)
  C22C 12/00 (2006.01)
  C22C 13/00 (2006.01)
  C22C 28/00 (2006.01)
  B23K 35/02 (2006.01)
  H01L 21/48 (2006.01)
  H01L 23/488 (2006.01)
  H01L 21/56 (2006.01)
  H05K 3/34 (2006.01)
  B23K 1/00 (2006.01)
  B23K 1/06 (2006.01)
  B23K 35/30 (2006.01)
  B23K 35/36 (2006.01)
  B23K 1/012 (2006.01)
  B23K 1/20 (2006.01)
  B23K 101/40 (2006.01)
  B23K 101/42 (2006.01)

(52) U.S. Cl.
  CPC ............... *B23K 1/06* (2013.01); *B23K 1/203* (2013.01); *B23K 35/0244* (2013.01); *B23K 35/26* (2013.01); *B23K 35/262* (2013.01); *B23K 35/302* (2013.01); *B23K 35/3006* (2013.01); *B23K 35/3613* (2013.01); *C22C 12/00* (2013.01); *C22C 13/00* (2013.01); *C22C 28/00* (2013.01); *H01L 21/4853* (2013.01); *H01L 21/563* (2013.01); *H01L 23/488* (2013.01); *H01L 23/49811* (2013.01); *H01L 23/49816* (2013.01); *H01L 23/49838* (2013.01); *H01L 24/11* (2013.01); *H01L 24/81* (2013.01); *H05K 3/3478* (2013.01); *B23K 2201/40* (2013.01); *B23K 2201/42* (2013.01); *H01L 24/13* (2013.01); *H01L 24/16* (2013.01); *H01L 2224/11005* (2013.01); *H01L 2224/11436* (2013.01); *H01L 2224/11522* (2013.01); *H01L 2224/13111* (2013.01); *H01L 2224/13139* (2013.01); *H01L 2224/13147* (2013.01); *H01L 2224/16145* (2013.01); *H01L 2224/16238* (2013.01); *H01L 2224/81075* (2013.01); *H01L 2224/81101* (2013.01); *H01L 2224/81191* (2013.01); *H01L 2224/81193* (2013.01); *H01L 2224/81205* (2013.01); *H01L 2224/81815* (2013.01); *H01L 2224/8391* (2013.01); *H01L 2224/83815* (2013.01); *H01L 2224/83886* (2013.01); *H01L 2924/01029* (2013.01); *H01L 2924/01322* (2013.01); *H01L 2924/10253* (2013.01); *H01L 2924/12042* (2013.01); *H05K 3/3436* (2013.01); *H05K 2201/10977* (2013.01)

(58) Field of Classification Search
  USPC ........................................................ 257/737
  See application file for complete search history.

(56) References Cited

U.S. PATENT DOCUMENTS

| | | | |
|---|---|---|---|
| 2008/0017995 A1* | 1/2008 | Karashima et al. | 257/778 |
| 2009/0085227 A1 | 4/2009 | Shiraishi et al. | |
| 2010/0078830 A1 | 4/2010 | Katsurayama et al. | |
| 2011/0297433 A1* | 12/2011 | Kuramoto et al. | 174/263 |

FOREIGN PATENT DOCUMENTS

| | | |
|---|---|---|
| JP | 2005-159102 A | 6/2005 |
| JP | 2006-114865 A | 4/2006 |
| JP | 3964911 B2 | 6/2007 |
| JP | 2011-233550 A | 11/2011 |
| WO | 2006/123554 A1 | 11/2006 |
| WO | 2008/054011 A1 | 5/2008 |
| WO | 2010093031 A1 | 8/2010 |

OTHER PUBLICATIONS

Office Action in counterpart Taiwan Appln. No. 101139840 dated Feb. 18, 2016 with English translation.
Office Action in counterpart Chinese Appln. No. 201280052668.X dated Feb. 29, 2016 with English translation.
Office Action in counterpart Taiwan Appln. No. 101139840 dated Aug. 29, 2016 with English translation.
Office Action of CN Appln. No. 201280052668.X dated Oct. 19, 2016 with English translation.
Office Action in counterpart Korean Appln. No. 10-2014-7011563 dated Mar. 31, 2016 with English translation.

* cited by examiner (a)

(b)

(c)

REFLOW FILM, SOLDER BUMP FORMATION METHOD, SOLDER JOINT FORMATION METHOD, AND SEMICONDUCTOR DEVICE

TECHNICAL FIELD

The present invention relates to a reflow film used in bump formation or the like on electronic components, wiring boards, substrates and semiconductor chips and the like, and also relates to a solder bump formation method, a solder joint formation method, and a semiconductor device formed using these methods.

BACKGROUND ART

As a method of mounting electronic components on circuit boards and the like, a method which uses solder bumps formed on the substrate electrodes is known. Further, when mounting a substrate with solder bumps to another substrate, the bumps of the substrate with solder bumps are mounted in positions opposing the electrodes of the other substrate that is to be connected, and by subsequently heating at a temperature of melting the solder bumps (reflow) or higher, the electrodes on the two substrates can be soldered together. In semiconductor packages, demands for smaller and thinner electronic equipment, increased functionality and higher performance have lead to an increase in the number of I/O electrodes (terminals), and a shortening of the distance between electrodes (terminals) (a narrower pitch). As a result, the configuration of semiconductor packages has changed from configurations using lead connections, such as QFP (Quad Flat Package), to configurations using flip-chip connections, which is a connection method in which bumps are positioned on the bottom of chips and used for connection purposes, such as BGA (Ball Grid Array) and CSP (Chip Scale Package). In the flip-chip connection method, solder bumps are formed in advance on the electrodes on a circuit board, and these solder bumps are joined to the circuit electrodes of a substrate or the like. Known methods for forming solder bumps include a method in which solder balls are mounted on the circuit electrodes of electronic components and the like, and a method in which a cream solder or a solder paste composed of a liquid or paste containing solder particles is printed onto the electrodes of a circuit board through the through-holes in a metal mask.

In the solder ball mounting method, because solder balls that have been prepared in advance are mounted, by altering the size of the prepared solder balls and narrowing the particle size distribution, the necessary bump height can be achieved, and fluctuation in the bump height can be suppressed to low levels. However, preparation of solder balls that satisfy these standards is costly. Further, the process of mounting the solder balls on the electrodes is complex, and introducing a solder ball mounting apparatus requires considerable capital investment. On the other hand, in the solder paste (cream solder) printing method, because air is incorporated within the paste during the printing operation, voids tend to be generated within the bumps. Further, there are fluctuations in the bump height, and opposing electrodes can sometimes not be joined.

In recent years, simple processes that utilize the self-assembly of a solder component, either on electrodes or between opposing electrodes, have been proposed as novel methods for forming solder bumps and novel methods for joining opposing electrodes. For example, in Patent Document 1, solder bumps are formed on electrodes using a paste comprising a solder powder, a convection additive and an epoxy resin. The paste is supplied to the electrode surface side of a substrate comprising electrodes, and by subsequently placing a flat plate on the paste and heating at a temperature of melting the solder powder, or higher, and at a temperature of boiling the convection additive or higher, gas bubbles of the convection additive generate a convection flow. This stirs the melted solder powder, causing bonding of particles of the solder powder, and the solder powder grows to a uniform size and accumulates on the electrodes. As a result, bumps having high uniformity are formed. In a similar manner, Patent Document 2 discloses that the opposing electrodes can be joined by using a solder. Further, after the opposing electrodes are joined by using the solder, an underfill can be formed by curing the epoxy resin scattered across the regions outside of the opposing electrodes.

The paste disclosed in the aforementioned Patent Document 1 provides a simpler process than the solder paste printing method or the solder ball mounting method, but because the process uses a liquid or paste-like composition, there are some problems such as inferior storage properties, transportability and handling properties during use. Further, although fluctuations in the height of the solder bumps can be suppressed, because gas bubbles are generated by the convection additive, these gas bubbles are readily incorporated within the bumps, and as a result, the void is prone to be formed in the bumps. Furthermore, in those cases when the curing of the thermosetting resin proceeds before the solder component accumulates on the electrodes, completion of the self-assembly of the solder component on the electrodes becomes difficult. Moreover, in the resin washing step performed after the heating, because of curing of the thermosetting resin, the resin cannot dissolve, or cannot be completely removed by washing.

Further, when opposing electrodes are joined by using solder in the manner described in Patent Document 2, a small amount of solder residue which has not migrated between the opposing electrodes is retained within the epoxy resin scattered across the regions outside of the opposing electrodes. This solder residue reduces the electrical resistance between adjacent electrodes, and can therefore cause short-circuits.

PRIOR ART DOCUMENTS

Patent Documents

Patent Document 1: JP 3964911 B
Patent Document 2: JP 2006-114865 A

SUMMARY OF THE INVENTION

Problems to be Solved by the Invention

The present invention has an object of providing a reflow film having excellent storage properties, transportability and handling properties during use, as well as providing a simple solder bump formation method for forming solder bumps selectively on only the electrodes using this reflow film, solder bumps formed using this method having minimal voids and minimal fluctuation in height, a substrate with solder bumps having the above solder bumps formed on the substrate electrodes, and a semiconductor device obtained using such a substrate. Further, the present invention also has an object of providing a simple solder joint formation method for forming solder joints selectively only between opposing electrodes using the above reflow film, without a step for forming solder bumps, as well as a solder joint region having minimal voids formed using this method, and a semiconductor device that is bonded using these solder joint regions. Moreover, the present invention also has an object of providing a simple solder joint formation method for mounting another substrate on a substrate with solder bumps formed using the above reflow film, as well as a solder joint region having minimal voids formed using this method, and a semiconductor device formed using this method.

Means for Solving the Problems

As a result of intensive research of the inventors of the present invention, by mounting and fixing a reflow film comprising a thermoplastic resin which is dissolvable in a solvent and solder particles, and a flat plate in this order to the electrode surface side of a substrate comprising electrodes, and subsequently heating at a temperature of melting the solder particles or higher, and at a temperature of liquefying the thermoplastic resin or higher, the solder component was localized on substrate electrodes by self-assembly. Then, it is found that by subsequently dissolving and removing the thermoplastic resin component containing solder residue that exists between the substrate and the flat plate outside the electrode region by using a solvent, solder bumps could be formed. Further, the inventors also applied this method to solder joints between opposing electrodes, and to solder joints between a substrate having solder bumps and another substrate, and thereby, accomplished the present invention. That is, the present invention is as follows.

(1) A reflow film comprising a thermoplastic resin which is dissolvable in a solvent, and solder particles, wherein the solder particles are dispersed in the film.

(2) The reflow film as described in the above item (1), wherein the solvent is water, an alcohol, or a mixture thereof.

(3) The reflow film as described in the above item (1) or (2), wherein the thermoplastic resin is a polyvinyl alcohol.

(4) The reflow film as described in the above item (3), wherein an average polymerization degree of the polyvinyl alcohol is from 100 to 1,000.

(5) The reflow film as described in the above item (4), wherein the saponification degree of the polyvinyl alcohol is from 28 to 98 mol %.

(6) The reflow film as described in any one of the above items (3) to (5), further comprising 20 to 300 parts by mass of a compound having a molecular weight of 500 or less which dissolves or disperses in water, with respect to 100 parts by mass of the polyvinyl alcohol.

(7) The reflow film as described in the above item (6), wherein the compound having a molecular weight of 500 or less is a low-molecular weight alcohol having a boiling point of 100° C. or higher.

(8) The reflow film as described in the above item (6) or (7), wherein the compound having a molecular weight of 500 or less is glycerol.

(9) The reflow film as described in the above item (1) or (2), wherein the thermoplastic resin is a polyvinylpyrrolidone.

(10) The reflow film as described in any one of the above items (1) to (9), further comprising a component for removing a metal oxide.

(11) The reflow film as described in any one of the above items (1) to (10), wherein in a cumulative particle size distribution of the solder particles, a particle size at a cumulative value of 10% from the fine particle end of the distribution and a particle size at a cumulative value of 90% are both within a range from 1 to 50 μm.

(12) The reflow film as described in any one of the above items (1) to (11), wherein the solder particles are formed from a lead-free solder.

(13) The reflow film as described in any one of the above items (1) to (12), wherein the solder particles are formed from an alloy of tin, silver and copper.

(14) The reflow film as described in any one of the above items (1) to (13), which comprises 30 to 500 parts by mass of the solder particles with respect to 100 parts by mass of the thermoplastic resin.

(15) A solder bump formation method which uses the reflow film as described in any one of the above items (1) to (14), comprising:

(A) a step of mounting the reflow film on an electrode surface side of a substrate comprising electrodes, (B) a step of mounting and fixing a flat plate to the reflow film, (C) a step of heating at a temperature of melting the solder particles in the reflow film or higher, and at a temperature of liquefying the thermoplastic resin or higher, and (D) a step of dissolving and removing the reflow film after completion of the step (C).

(16) The solder bump formation method as described in the above item (15), wherein the thermoplastic resin is a polyvinyl alcohol, the reflow film comprises 20 to 300 parts by mass of a compound having a molecular weight of 500 or less which dissolves or disperses in water with respect to 100 parts by mass of the polyvinyl alcohol, and the step (C) is a step of heating at a temperature of melting the solder particles in the reflow film or higher, and at a temperature of liquefying the polyvinyl alcohol and the compound having a molecular weight of 500 or less which dissolves or disperses in water or higher.

(17) The solder bump formation method as described in the above item (15) or (16), wherein the step (C) is performed under an inert gas atmosphere.

(18) The solder bump formation method as described in any one of the above items (15) to (17), wherein the step (C) is performed in a state where pressure is applied from the flat plate toward the substrate.

(19) The solder bump formation method as described in any one of the above items (15) to (18), wherein in the step (D), the reflow film comprising residual solder particles that exists in regions outside the electrode surfaces is removed by water, an alcohol, or a mixed solvent thereof.

(20) The solder bump formation method as described in any one of the above items (15) to (19), wherein in the step (D), ultrasonic waves are irradiated.

(21) A solder joint formation method which uses the reflow film as described in any one of the above items (1) to (14), comprising:

(a) a step of mounting the reflow film on an electrode surface side of a substrate comprising electrodes, (b) a step of mounting an electrode surface side of another substrate comprising electrodes on the reflow film, and fixing the substrates in positions where the electrodes of the upper and lower substrates oppose one another across the reflow film, (c) a step of heating, in a state described above in (b), at a temperature of melting the solder particles in the reflow film or higher, and at a temperature of liquefying the thermoplastic resin or higher, and (d) a step of dissolving and removing the reflow film after completion of the step (c).

(22) The solder joint formation method as described in the above item (21), wherein the thermoplastic resin is a polyvinyl alcohol, the reflow film comprises 20 to 300 parts by mass of a compound having a molecular weight of 500 or less which dissolves or disperses in water with respect to 100 parts by mass of the polyvinyl alcohol, and the step (c) is a step of heating, in a state described above in (b), at a temperature of melting the solder particles in the reflow film or higher, and at a temperature of liquefying the polyvinyl alcohol and the compound having a molecular weight of 500 or less which dissolves or disperses in water or higher.

(23) The solder joint formation method as described in the above item (21) or (22), wherein the step (c) is performed under an inert gas atmosphere.

(24) The solder joint formation method as described in any one of the above items (21) to (23), wherein the step (c) is performed in a state where pressure is applied to the mounted substrate.

(25) The solder joint formation method as described in any one of the above items (21) to (24), wherein in the step (d), the reflow film comprising residual solder particles that exists in regions outside the regions between the opposing electrodes is removed by water, an alcohol, or a mixed solvent thereof.

(26) The solder joint formation method as described in any one of the above items (21) to (25), wherein in the step (d), ultrasonic waves are irradiated.

(27) A solder joint formation method which uses a substrate with solder bumps prepared by forming bumps on electrodes of a substrate using the solder bump formation method as described in any one of the above items (15) to (20), comprising:

(E) a step of applying a component for removing metal compounds to at least one of the solder bumps of the substrate with solder bumps, and the electrodes of another substrate comprising electrodes which is to be connected to the substrate with solder bumps, (F) a step of either mounting an electrode surface side of the other substrate on the solder bumps of the substrate with solder bumps, or mounting the solder bumps side of the substrate with solder bumps on the electrodes of the other substrate, so that electrodes of the upper and lower substrates oppose one another, and (G) a step of heating, in an opposing state described above in (F), at a temperature of melting the solder bumps or higher.

(28) The solder joint formation method as described in the above item (27), wherein the step (G) is performed in a state where pressure is applied to the mounted substrate.

(29) A solder bump formed using the solder bump formation method as described in any one of the above items (15) to (20).

(30) A substrate with solder bumps prepared by forming bumps on the electrodes of a substrate using the solder bump formation method as described in any one of the above items (15) to (20).

(31) The solder bump as described in the above item (29), wherein the substrate is a semiconductor chip or an interposer.

(32) The substrate with solder bumps as described in the above item (30), wherein the substrate is a semiconductor chip or an interposer.

(33) A solder joint region, formed between opposing electrodes of two substrates comprising electrodes using the solder joint formation method as described in any one of the above items (21) to (26), or either of the above items (27) and (28).

(34) A semiconductor device, having the solder joint region as described in the above item (33), wherein the combination of the substrates comprising electrodes is a combination of a semiconductor chip and an interposer, a semiconductor chip and a semiconductor chip, or an interposer and an interposer.

This Application is related to the subject matter disclosed in prior Japanese Applications 2011-235479, 2011-235484 and 2011-235489, filed on Oct. 26, 2011, the entire contents of which are incorporated herein by reference.

Effects of the Invention

The present invention can provide a reflow film having excellent storage properties, transportability, and handling properties during use, and can also provide a simple solder bump formation method for forming solder bumps selectively on only the electrodes using this reflow film. The solder bumps formed using this method have minimal voids, low electrical resistance (high electrical conductivity), and minimal fluctuation in height. Further, the present invention can also provide a substrate with solder bumps having the above bumps formed on the substrate electrodes, and a semiconductor device obtained using such a substrate. Furthermore, the present invention can also provide a simple solder joint formation method for forming solder joints selectively only between opposing electrodes using the above reflow film, without a step for forming solder bumps. Moreover, the present invention can also provide a simple solder joint formation method for mounting another substrate on the solder bumps of the aforementioned substrate with solder bumps, as well as a solder joint region and a semiconductor device having low electrical resistance (high electrical conductivity) and minimal voids formed using the above methods.

EMBODIMENTS FOR CARRYING OUT THE INVENTION

Figure 1:
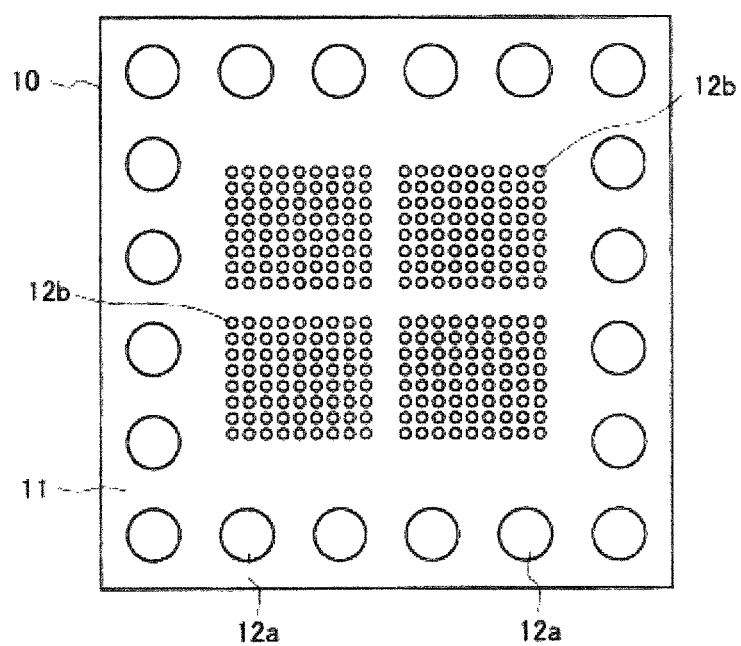
FIG. 1 is a schematic plan view of a substrate (interposer) comprising electrodes which is used in the examples and comparative examples of the present invention.

Preferred embodiments of the present invention are described below in detail. However, the present invention is in no way limited by the following embodiments.
(Reflow Film)

The "reflow film" in a first embodiment of the present invention is a film comprising a thermoplastic resin dissolvable in a solvent (hereafter also referred to as simply "the resin") and solder particles, wherein the solder particles are dispersed in the film.

Further, the solder particles can also be dispersed in a resin composition containing an additive component such as a flux agent. In other words, a reflow film in a second embodiment of the present invention is a film comprising solder particles dispersed in a resin composition containing a polyvinyl alcohol (a) and a compound (b) having a molecular weight of 500 or less which dissolves or disperses in water.

Furthermore, a reflow film in a third embodiment of the present invention comprises a polyvinyl alcohol (a1) having an average polymerization degree of 100 to 1,000 as the aforementioned resin.

The dispersion of the solder particles may include partial precipitation of the solder particles in the thickness direction of the film, namely the vertical direction, during production of the film.

The reflow film is a film-like solid at normal temperature (25° C.). This reflow film is mounted and fixed to a circuit board or the like having electrodes, and when heated at a temperature of melting the solder particles or hither and at a temperature of liquefying the resin or higher, the solder component accumulates and is localized on the surfaces of the electrodes by self-assembly. Further, when the electrode surface sides of two substrates are fixed in positions where the electrodes oppose one another across the reflow film, and heated in the same manner as that described above, the opposing electrodes are joined by solder.

By heating at this temperature, the composition comprising the solder and the resin adopts a state of liquid/liquid phase separation, and the melted solder particles are able to move through the liquid resin. As a result, the solder component accumulates on the electrodes by self-assembly, whereas the resin component becomes localized in regions outside the electrodes. When a plurality of electrodes exists, the solder component accumulates on the surface of each electrode, whereas no localization of the solder component occurs in regions outside of the electrodes. As the solder accumulates between opposing electrodes, the electrodes become joined by the solder. When cooled in this state, the solder solidifies in a state where the solder particles are aggregated on the electrode surfaces, namely a state where the solder is adopted a lump-like state, or a state where the electrodes have been joined with solder. In other words, solder bumps or solder joints are formed selectively on only the surfaces of the plurality of electrodes or only between the opposing electrodes.

When a thermosetting resin is used as the resin in the reflow film instead of a thermoplastic resin such as a polyvinyl alcohol, a resin network is formed by heating. Therefore, the solder particles are unable to flow, and accumulation of the solder particles on or between the electrodes is less likely to occur. Further, even if accumulation occurs, the resin does not dissolve in the subsequent resin dissolution and removal step (details of which are described below), and therefore thermosetting resins cannot be used in the present invention. In particular, the melting temperature of lead-free solder is a high temperature of 200° C. or higher, and because a thermosetting resin would cure rapidly at this temperature, it is inappropriate for use as the resin in the present invention.

Further, when a thermosetting resin is used, an underfill can be formed at the same time as the solder joints by curing the thermosetting resin after the solder joint formation described above, and thereby, the packaging process can be shortened. However, a solder residue which is not migrated between the electrodes exists, albeit in a small amount, within the thermosetting resin in the regions outside of the electrodes. This residual solder reduces the electrical resistance between adjacent electrodes, and can cause short-circuits.
(Description of Self-Assembly of Solder Component)

In the liquid/liquid phase separation state, the reason that the solder particles accumulate on the electrode surfaces is thought to be as follows. That is, the solder exhibits high wettability relative to metals of the electrode, but has poor wettability relative to components in regions outside the electrodes on the substrate surface, such as the solder resist. That is, the contact angle is small on the high-wettability electrode surfaces and the center of gravity of the liquid droplets of solder is low, and therefore the solder droplets are stable. Moreover, a mutual attraction interaction also occurs between the solder and the electrodes, thereby holding the solder on the electrodes. In contrast, the contact angle is large in the low-wettability regions outside the electrodes, and the center of gravity of the liquid droplets of solder is high, and therefore the solder droplets are unstable. Moreover, a mutual repulsion interaction occurs between the solder and the electrodes, causing the solder to move around (and be repelled in some cases). As a result, the solder component collects and is accumulated on the electrodes.

Further, the reason that the solder component accumulates on the electrodes can also be explained using the Laplace equation which indicates the pressure difference inside a liquid droplet of solder. In the process in which liquid droplets of different size make contact and form a single larger liquid droplet, it is known that the liquid droplet of smaller radius is sucked into the liquid droplet of larger radius. This phenomenon is attributed to the fact that the liquid droplet of smaller radius has a higher internal pressure than the liquid droplet of larger radius, with this pressure difference causing the smaller liquid droplet to be sucked into the larger liquid droplet. Applying this thinking to the liquid droplets of solder can explain the accumulation of the solder component on the electrodes.

For example, when the solder liquid droplets exist scattered across the electrodes and the regions outside the electrodes, because the contact angle is lower on the electrodes, the radius of curvature is larger, whereas in the regions outside the electrodes, because the contact angle is higher, the radius of curvature is smaller. As a result, the solder in the non-electrode regions with a smaller radius of curvature has a higher pressure than the solder on the electrodes with a larger radius of curvature, and therefore the solder in the regions outside the electrodes migrates toward the electrodes due to this pressure difference (12th Symposium on Microjoining and Assembly Technology in Electronics, Feb. 2-3, 2006, Yokohama, pp. 381-386). As a result of this migration, solder particles accumulate on the electrodes, and when solder particles from regions outside the electrodes approach and contact the solder lumps accumulated on the electrodes, these solder particles from non-electrode regions with a small radius of curvature are sucked into the solder lumps on the electrodes. It is surmised that as the above process is repeated, the solder component is accumulated by self-assembly on the electrodes.

(Features of the Reflow Film)

The reflow film of the present invention is a film-like solid, and therefore, components capable of causing reaction are unable to disperse readily, as is possible in liquids, as a result, the reflow film has excellent storage properties. Further, because there is no concern of liquid leakage or the like, the film has excellent transportability. Moreover, the reflow film exhibits minimal tackiness, and displays excellent handling properties during use.

Furthermore, because the reflow film of the present invention is a film-like solid having solder particles dispersed therein, it can form solder bumps or solder joints in a simple process in which the film is mounted and fixed to a desired position on a circuit board, and subsequently heated, and then the residue including residual solder is washed away with a solvent. That is, during use of the reflow film, there is no need to perform printing using a complex metal mask, or perform mounting of solder balls.

(Washing Solvent)

There are no particular limitations on the washing solvent used for dissolving and removing the reflow film, but in terms of minimizing environmental impact and ease of availability, water is the most preferred. In those cases where the resin component is only sparingly soluble in water, a mixed solvent of water and an alcohol or an alcohol solvent by itself is preferable. There are no particular limitations on the mixing ratio between the water and the alcohol. Distilled water, ion-exchanged water or tap water or the like can be used as the water, above all, distilled water or ion-exchanged water with minimal impurities is preferable. Examples of the alcohol include methanol, ethanol and n-propanol and the like, and methanol and ethanol are particularly preferred due to their high polarity. Another reason for using a high-polarity water or alcohol as the solvent for washing the resin is that highly polar solvents have a high surface tension, and can therefore readily enter narrow spaces via the capillary phenomenon. This means that such highly polar solvents are ideal for washing very narrow spaces such as the space between a flat plate and a substrate, the space between two substrates, the spaces between adjacent bumps, and the spaces between adjacent solder joint regions.

(First Embodiment, Thermoplastic Resin)

The reflow film of the present invention must be able to be dissolved and removed with the above solvent after the heating step, together with the solder residue that exists in the regions either outside the electrodes or outside the regions between the opposing electrodes. Therefore, the thermoplastic resin that functions as the film material used in the reflow film is preferably a water-soluble resin. Examples of the thermoplastic resin include polyvinyl alcohol, polyvinylpyrrolidone, polyethylene glycol, polypropylene glycol, polyacrylic acid, polyacrylamide, starch, and modified cellulose and the like. Two or more of these resins may be used in a mixture. Further, a copolymer produced by polymerizing two or more monomers can also be used. Of these, a polyvinyl alcohol or polyvinylpyrrolidone is particularly preferable from the viewpoints of water solubility and film formability.

Polyvinyl alcohol is particularly preferable from the viewpoints of water solubility and film formability, and is therefore used as the thermoplastic resin in the second and third embodiments. Moreover, because polyvinyl alcohol is a polyhydric alcohol, it has an action of removing the oxide film from the solder particles, which is extremely desirable.

(Second Embodiment ,Combination of Bump Formability and Film Formability)

A reflow film comprising solder particles dispersed in a thermoplastic polyvinyl alcohol can form solder bumps or solder joints via a simple process, and exhibits excellent handling properties. Bump formability and film formability exist in a trade-off type relationship. In other words, in the bump formation process which occurs by self-assembly of the solder, in order for the solder particles to be accumulated on the electrodes, the viscosity of the film at the reflow temperature must be low, meaning a polyvinyl alcohol of low molecular weight is preferable. On the other hand, in order to improve the handling properties, a polyvinyl alcohol of high molecular weight is preferably used to form the film. When it comes to commercially available polyvinyl alcohols, the better film formability the polyvinyl alcohols provides, the higher molecular weight, and therefore in the second embodiment of the present invention, a compound having a molecular weight of 500 or less which either dissolves or forms an emulsion-like dispersion in water is added to the polyvinyl alcohol to improve the bump formability. That is, in order to achieve a favorable combination of bump formability and film formability, a compound having a molecular weight of 500 or less which dissolves or disperses in water is added to the reflow film. This compound functions as a plasticizer, and has the effect of weakening the interaction between molecules, and is therefore able to reduce the viscosity at the reflow temperature.

Further, it is thought that the fact that the compound itself has a low viscosity also has an effect in reducing the viscosity at the reflow temperature.

(Second Embodiment ,Compound having a Molecular Weight of 500 or less that is added to the Reflow Film)

The compound having a molecular weight of 500 or less which dissolves or disperses in water (hereafter also referred to as "the low-molecular weight component") is preferably a liquid or a solid at normal temperature (25° C.). Further, in order to prevent volatilization of the compound from the film system in the drying step performed during film formation, the boiling point of the compound is preferably higher than the film drying temperature. Furthermore, if the compound volatilizes from the film system during the self-assembly process, then a viscosity reduction effect cannot be expected, and therefore the compound preferably does not volatilize from the film system even at the reflow temperature. The preferred boiling point for the low-molecular weight component varies depending on the reflow temperature, but the boiling point of the low-molecular weight component is preferably 100° C. or higher, more preferably 130° C. or higher, still more preferably 150° C. or higher, particularly preferably 200° C. or higher, and most preferably 270° C. or higher. Further, in order to enable uniform mixing with the polyvinyl alcohol, a low-molecular weight alcohol having a molecular weight of 500 or less is preferable. Examples of such low-molecular weight alcohols include glycerol (boiling point: 290° C., molecular weight: 92), ethylene glycol (boiling point: 197° C., molecular weight: 62), and a vinyl alcohol oligomer (average molecular weight: 440). Among these, glycerol is extremely preferable, because the boiling point of glycerol is higher than the reflow temperature of a SnAgCu-based lead-free solder. The molecular weight of the low-molecular weight component is 500 or less, and is preferably 300 or less, more preferably 200 or less, and still more preferably 100 or less. In general, the viscosity reduction effect is enhanced as the molecular weight decreases, and therefore the molecular weight of the low-molecular weight component of the present embodiment is preferably as low as possible. Although there are no particular limitations on the lower limit for the molecular weight of the low-molecular weight compound, from the viewpoint of ensuring low volatilization, the molecular weight is preferably at least 50, and more preferably 60 or more.

(Second Embodiment ,Amount of Low-Molecular Weight Component)

In the present embodiment, the amount of the low-molecular weight component is preferably from 20 to 300 parts by mass with respect to 100 parts by mass of the polyvinyl alcohol. The amount of the low-molecular weight component varies depending on the type of low-molecular weight component used, but in general, is preferably from 20 to 200 parts by mass, more preferably from 30 to 100 parts by mass, and particularly preferably from 30 to 50 parts by mass. Provided the amount of the low-molecular weight component is the aforementioned lower limit or more, the viscosity reduction effect is satisfactory, and the bump formability tends to be favorable. Further, provided the amount is the upper limit or less, tack is minimal, the handling properties are good, and a film can be formed satisfactorily.

(Molecular Weight and Film Formability of Resin)

In the heating step in which heating is performed at a temperature of melting temperature the solder particles or higher, and at a temperature of liquefying the thermoplastic resin or higher, in order to enable the solder particles to accumulate on the electrodes or between the opposing electrodes, it is preferable that the viscosity of the resin is low enough to enable the solder particles to flow. The lower the viscosity of the resin, the more actively the solder particles move around, and the more readily the solder particles make contact with and become accumulated within the solder lumps that have already accumulated on the electrodes. Therefore, the viscosity of the resin is preferably as low as possible. For this, the softening point, which indicates the temperature at which the resin softens, is preferably a low value. However, a low softening point alone does not necessarily mean the viscosity will be low enough for the solder particles to flow. That is, in those cases where the resin softens when the temperature reaches or exceeds the softening point, but the molecular weight of the resin is too high, because the entangled molecular chains are difficult to untangle, it is difficult to achieve a reduction in viscosity that is sufficient to allow the solder particles to flow.

Accordingly, in order to lower the viscosity of the resin, the molecular weight (or the polymerization degree) of the resin is lowered to minimize chain entanglement. Further, a resin with a lower molecular weight generally dissolves more quickly in the reflow film dissolution and removal step that is performed after the heating step. This means that a resin with a lower molecular weight is preferable. On the other hand, as the molecular weight of the resin is lowered, the film formability at normal temperatures tends to deteriorate, and therefore a resin having a low molecular weight within the range of molecular weights that enable film formation is preferable.

(First Embodiment ,Molecular Weight of Resin)

In the first embodiment, the preferred molecular weight for the resin varies depending on the type of resin and the saponification degree, but for example in the case of a polyvinyl alcohol having a saponification degree of 88%, the weight-average molecular weight is preferably from 3,000 to 60,000, more preferably from 4,000 to 40,000, and still more preferably from 5,000 to 30,000. In the case of a polyvinylpyrrolidone, the weight-average molecular weight is preferably from 10,000 to 500,000, more preferably from 20,000 to 300,000, and still more preferably from 30,000 to 100,000. When the molecular weight satisfies this range, the resin exhibits more satisfactory film formability than those cases where the molecular weight is lower than this range. Further, when the molecular weight satisfies this range, because of the fluidity of the solder particles in the heating step, the solder tends to accumulate more readily on the electrodes than those cases where the molecular weight is higher than this range. Moreover, when the molecular weight satisfies this range, a long time is not required for dissolution of the resin in the resin dissolution and removal step, and the resin can be dissolved and removed completely.

(Second Embodiment ,Molecular Weight of Polyvinyl Alcohol)

Of the various resins that can be used in the second embodiment, the molecular weight of the polyvinyl alcohol is preferably within the same range as that described for the polyvinyl alcohol in the first embodiment, for the same reasons as described above.

(Third Embodiment ,Polymerization Degree of Polyvinyl Alcohol)

In the third embodiment, the preferred polymerization degree for the polyvinyl alcohol varies depending on the saponification degree of the polyvinyl alcohol, but the average polymerization degree is preferably from 100 to 1,000, more preferably from 150 to 800, still more preferably still more preferably from 200 to 700, and most preferably from 250 to 500. In general, when the average polymerization degree satisfies this range, the resin exhibits more satisfactory film formability than those cases where the polymerization degree is lower than this range. When the average polymerization degree satisfies this range, because of the fluidity of the solder particles in the heating step, the solder tends to accumulate more readily on the electrodes than those cases where the polymerization degree is higher than this range. Moreover, when the average polymerization degree satisfies this range, a long time is not required for dissolution of the reflow film in the dissolution and removal step, and the film can be dissolved and removed completely.

The polymerization degree of the polyvinyl alcohol described in the present invention refers to the value measured in accordance with JIS K 6726 (Testing methods for polyvinyl alcohol) prescribed by the Japanese Industrial Standards (JIS).

<Average Polymerization Degree>

Among commercially available polyvinyl alcohols, Poval (a registered trademark), which is a polyvinyl alcohol manufactured by Kuraray Co., Ltd., lists catalog values for the viscosity and the average polymerization degree measured in accordance with the aforementioned JIS K 6726 (Testing methods for polyvinyl alcohol). In the present invention, these listed average polymerization degree values are used as values for the average polymerization degree.

On the other hand, Gohsenol (a registered trademark) and Gohsefimer (a registered trademark), which are polyvinyl alcohols manufactured by The Nippon Synthetic Chemical Industry Co., Ltd., do not list value for the average polymerization degree in the catalog, and therefore values for the polymerization degree measured in accordance with the aforementioned JIS K 6726 (Testing methods for polyvinyl alcohol) are used as values for the average polymerization degree.

(Third Embodiment ,Saponification Degree of Polyvinyl Alcohol)

The polyvinyl alcohol can be obtained by hydrolyzing the ester groups of a polyvinyl acetate obtained by an addition polymerization of vinyl acetate. The saponification degree (units: mol %) is used to indicate the degree of hydrolysis of the ester groups of the polyvinyl acetate. A high saponification degree for the polyvinyl alcohol indicates a high rate of hydrolysis of the ester groups. For example, a polyvinyl alcohol having a saponification degree of 100 mol % means that all of the ester groups in the polyvinyl acetate have been converted to hydroxyl groups. The solubility of the polyvinyl alcohol tends to improve as the saponification degree increases, but a polyvinyl alcohol with a saponification degree of 100 mol % exhibits a high level of crystallinity and is therefore difficult to dissolve. As a result, for polyvinyl alcohols of the same molecular weight, those polyvinyl alcohols for which the saponification degree is approximately 90 mol % are the most easily dissolved. Therefore, from the viewpoint of the ease of dissolution and removal of the resin using water after the self-assembly process, a polyvinyl alcohol having a saponification degree of 98 mol % or less is preferable.

A polyvinyl alcohol having a low saponification degree exhibits inferior solubility in water, but can be dissolved in a mixed solvent of methanol and water. On the other hand, because the amount of hydroxyl groups decreases and the amount of ester groups increases, the interactions between molecules tend to weaken. This has the effect of reducing the viscosity, which is preferable from the viewpoint of promoting the self-assembly of the solder. A polyvinyl alcohol saponification degree of 28 mol % or more is preferable in terms of the level of viscosity reduction during reflow and the ease of dissolution and removal after self-assembly.

The saponification degree of the polyvinyl alcohol is more preferably 92 mol % or less, still more preferably 90 mol % or less, and particularly preferably 89 mol % or less.

The polyvinyl alcohol saponification degree mentioned in the present invention refers to the saponification degree measured in accordance with JIS K 6726 (Testing methods for polyvinyl alcohol) prescribed by the Japanese Industrial Standards (HS).

(Removal of Metal Oxides)

The reflow film of the present invention preferably contains a component for removing metal oxides. This is because the surfaces of the solder particles are covered with metal oxides with high-melting point, and if these metal oxides are not removed, then melting the solder becomes difficult. Generally, acidic substances, basic substances and alcohols and the like are considered effective in removing metal oxides from the surfaces of solder particles, and are known as flux agents. Specific examples of flux agents include salicylic acid, benzoic acid, m-dihydroxybenzoic acid, sebacic acid and rosin and the like. Further, a commercially available viscosity-modified flux agent can also be used. However, depending on the particular combination of the resin and the flux agent, the solder particles may sometimes lose fluidity, and therefore an appropriate flux agent is selected. The reason for this phenomenon is not entirely clear, but it is thought to be due to the formation of a network via a condensation reaction or the like. If a network is formed, then dissolution even in solvents such as water becomes difficult, which effects on the resin dissolution and removal step.

Further, this network formation is not only affected by the combination of the resin and the flux agent, but is also heavily influenced by the atmosphere. Compared with the case of an open atmosphere, network formation is less likely to occur in an inert gas atmosphere of nitrogen or the like. Therefore, at least the resin heating step is preferably performed under an inert gas atmosphere.

Furthermore, if the electrode surfaces are coated with a metal oxide, then this causes a deterioration in the solder wettability, but because the flux agent described above also has the effect of removing this metal oxide, containing the aforementioned flux agent is also preferable in terms of improving the wetting properties between the solder and the electrodes.

When the resin is a polyvinyl alcohol, from the viewpoints of the removability of the oxide film on the solder particles, the fluidity of the solder particles, and the ease of dissolution and removal of the resin after self-assembly of the solder component, the flux agent is preferably salicylic acid, benzoic acid, m-dihydroxybenzoic acid or sebacic acid, and is more preferably salicylic acid.

(Amount of the Flux Agent)

The amount of the flux agent varies depending on factors such as the amount of the solder particles, the surface area of the solder particles, and the thickness of the oxide film on the surfaces of the solder particles, but in general, is preferably from 1 to 40 parts by mass, more preferably from 2 to 30 parts by mass, still more preferably from 3 to 20 parts by mass, particularly preferably from 3 to 15 parts by mass, and most preferably from 4 to 12 parts by mass, with respect to 100 parts by mass of the resin. Provided the amount is the aforementioned lower limit or more, the oxide film tends to be able to be removed satisfactorily. Further, provided the amount is the upper limit or less, the formation of a network on the resin, impairing fluidity of the solder particles, tends to be suppressed. Moreover, if the flux agent is used in excess, then residual flux agent tends to remain after the resin washing step, and there is a possibility that this may cause corrosion of the solder bumps.

(Particle Size of Solder Particles)

The solder particles used in the reflow film of the present invention preferably have a particle size that is smaller than the shortest distance between adjacent electrodes (the shortest distance that links the outside edges of two electrodes). If the reflow film contains a large amount of solder particles having a particle size that is larger than the shortest distance between adjacent electrodes, then the possibility that the solder bridges the gap between adjacent electrodes and causes a short-circuit increases. On the other hand, because solder particles having a small particle size of 5 μm or less are generally prone to aggregation, and tend to be difficult to handle in an open atmosphere, and therefore the production, storage and use of the reflow film are preferably all conducted under an inert gas atmosphere of nitrogen gas or the like.

The particle size of the solder particles used in the reflow film of the present invention is preferably such that in the cumulative particle size distribution of the solder particles, the particle size ($d10$) at a cumulative value of 10% from the fine particle end of the distribution and the particle size ($d90$) at a cumulative value of 90% are both within a range from 1 to 50 μm. The preferred particle size range varies depending on the size of the electrodes and the pitch between electrodes and the like, and therefore it is preferable to use solder particles having an appropriate particle size. Generally, the range of particle sizes for the solder particles from $d10$ to $d90$ is preferably from 2 to 45 μm rather than the aforementioned 1 to 50 μm, and is more preferably from 5 to 40 μm, still more preferably from 8 to 30 μm, still more preferably from 10 to 25 μm, particularly preferably from 10 to 20 μm, and most preferably from 10 to 15 μm. Provided the number of solder particles having a large particle size is not too large, problems such as the formation of bridges between electrodes during the solder self-assembly process, and precipitation in the varnish described below that is used to prepare the reflow film can be avoided. Provided there are no particles for which the particle size is too small, aggregation of solder particles unlikely occurs even during the varnish preparation process, and the handling properties are favorable even in an atmosphere other than a nitrogen atmosphere.

(Composition of Solder Particles)

Examples of the composition of the solder particles used in the reflow film of the present invention include not only SnPb systems, but also lead-free SnAgCu systems, SnAg systems, SnCu systems, SnZnBi systems and SnAgBiIn systems and the like. Further, SnBi systems (the melting point of 42Sn-58Bi is 138° C.) and InSn systems (the melting point of 52In-48Sn is 118° C.), which are lead-free solders having a low melting point, are also exemplified. SnPb systems have traditionally been preferred for their mechanical properties and reliability, but because of the enactment by the EU of the RoHS directive, which prohibits the use of toxic substances such as lead, for environmental safety reasons, lead-free solder particles are preferably used in the present invention. Of lead-free solders, it is particularly preferable to use solder particles formed from an alloy of tin, silver and copper, namely SnAgCu system solder particles, which are the most widely used lead-free solders for semiconductor joints and the like, because although such solders tend to have slightly higher melting points, their mechanical properties and reliability are more favorable.

The melting temperature of SnAgCu system solder particles exceeds 200° C. (the melting point of Sn-3Ag-0.5Cu is approximately 217° C.), and therefore if a thermosetting resin such as an epoxy resin are used, curing of the resin is proceed, and there is a high probability that the fluidity of the solder particles is lost. Because a thermoplastic resin is used as the resin of the reflow film of the present invention, the solder particles are able to flow even at high temperatures exceeding 200° C., and therefore the solder particles can accumulate on the electrodes, enabling formation of solder bumps and solder joints. Further, in the case of materials such as liquid crystals is deteriorated in high-temperature processes exceeding 200° C., SnBi system or InSn system solder particles which are lead-free and also have a low melting point can be used.

(Amount of Solder Particles)

The ideal addition amount of the solder particles varies depending on factors such as the size of the electrodes, the pitch between the electrodes, the required bump height and the distance between opposing electrodes and the like, but the amount is preferably from 30 to 500 parts by mass, more preferably from 50 to 400 parts by mass, still more preferably from 80 to 300 parts by mass, and particularly preferably from 100 to 200 parts by mass with respect to 100 parts by mass of the aforementioned resin.

(Reflow Film Preparation Method)

A typical method of preparing the reflow film is described below. First, the resin (for example, the polyvinyl alcohol and the low-molecular weight component in the case of the second embodiment) is dissolved in a varnish solvent composed of water, an alcohol or a mixture thereof, thus preparing a resin solution. This resin solution is mixed with a prescribed amount of the solder particles to prepare a varnish. Subsequently, an applicator with an opening having a fixed gap is used to apply the varnish to one main surface of a support film, thus forming a coating film. And the, by heating in an oven to remove the varnish solvent, the reflow film is obtained.

(Method of Adding Flux Agent)

A flux agent is preferably added to the aforementioned varnish, and this is particularly preferable when the resin itself has minimal flux action. Although the flux agent may be added after mixing the resin, the solder particles and the varnish solvent, the flux agent is preferably added directly to the solder particles to remove the oxide film before addition of the solder particles to the resin solution, in light of the effect of removing the oxide film from the solder particles. In this case, when the flux agent is a liquid it may be used in unchanged form, whereas when the flux agent is a solid, it is preferably dissolved in a solvent prior to use.

(Notes regarding Viscosity and Storage of Varnish)

There is a possibility that the solder particles precipitate in the varnish, and therefore adjustment of the varnish viscosity is very important. When the viscosity is high, the solder particles are less likely to precipitate, but the smoothness of the coating film surface tends to be decreased upon formation of the coating film, with streaks and the like occurring on the surface, and therefore the amount of added varnish solvent is adjusted so as to achieve an appropriate viscosity. Further, after adjustment of the varnish, it is preferable to apply the varnish prior to long-term storage so that precipitation of the solder particles does not occur.

(Drying of Coating Film)

In order to obtain the reflow film of the present invention, the drying temperature and the drying time for the coating film are preferably set to an appropriate temperature and time in accordance with the solvent varnish and the film thickness, within a temperature range that is less than the melting point of the solder particles.

(Shape of Reflow Film)

The thickness of the reflow film of the present invention can be set appropriately as required, and for example, can be set within a range from 0.01 to 0.5 mm. However, in order to avoid the case where the solder particles protrude from a reflow film that is thinner than the particle size of the solder particles, the thickness of the reflow film is preferably set with appropriate consideration of the particle size of the solder particles and the intended use of the reflow film.

Further, the size (surface area) of the reflow film can be set with due consideration of the size of the substrate being used. Specifically, the size of the reflow film is preferably set to a surface area that is slightly broader than the region in which the electrode (group) is positioned. Alternatively, the reflow film may be formed in advance with a size larger than that required, and then cut to the desired size at the time of use.

In a fourth embodiment of the present invention, solder bumps can be formed on the electrodes of a substrate using the reflow film according to any one of the first to third embodiments of the present invention described above.

In a fifth embodiment of the present invention, solder joints can be formed between opposing electrodes using the aforementioned reflow film.

The substrate used in the formation method described above is described below for each step of the formation process, with reference to the drawings.

(Substrate)

The substrate used in the solder bump formation method of the fourth embodiment of the present invention and the solder joint formation method of the fifth embodiment of the present invention may be any substrate having one or more electrodes, and examples include printed wiring boards onto which the various types of electronic components are mounted, including semiconductor chips, interposers and mother boards. In order to improve the wettability of the electrode to the solder particles, a UBM (Under Bump Metallization) layer is preferably formed on the surface of each electrode. Copper is generally used for the circuits, but examples of the UBM layer formed on the surface of the copper circuits include Cu/Ni/Au and Cu/Ni—P/Au and the like. The Au at the outermost surface of the electrode improves the wettability to solder, whereas the underlying Ni layer inhibits the diffusion of the copper, thereby inhibiting the formation of an IMC (Intermetallic Compound) layer which is considered to affect the reliability of solder joints.

Further, when soiling such as oil or grease or the like is adhered to the surface of the substrate electrodes, the solder wettability is decreased, which has an adverse effect on the self-assembly process, and therefore a degreasing treatment using an organic solvent, an acidic aqueous solution or a basic aqueous solution or the like is preferably performed in advance. Performing ultrasonic irradiation during the degreasing process enhances the cleaning effect and is therefore preferable. When a UBM layer is not formed on the electrode surface, an oxide film forms readily on the electrode surface, and the electrode surface also tends to gradually oxidize after oxide removal, but an acidic aqueous solution or basic aqueous solution also exhibits an oxide removal effect in addition to the degreasing effect, and therefore washing with this type of aqueous solution is also preferable from the viewpoint of removing oxides from the electrode. Furthermore, when the reflow film contains a flux agent, oxides can be removed during the heating step, not only from the surfaces of the solder particles, but also from the electrode surfaces.

In terms of the size of the electrodes and the pitch between electrodes on the substrate, as described above, if the shortest distance between adjacent electrodes (the shortest distance that links the outside edges of two electrodes) is equal to or less than the particle size of the solder particles, bridges tend to form readily between adjacent electrodes, and therefore the particle size of the solder particles used in the reflow film is preferably selected appropriately in accordance with the shortest distance between adjacent electrodes. For example, in the cumulative particle size distribution of the solder particles, when the particle size at a cumulative value of 10% from the fine particle end of the distribution and the particle size at a cumulative value of 90% are both within a range from 1 to 50 μm, a substrate in which the shortest distance between adjacent electrodes exceeds 1 μm is preferable.

FIG. 1 illustrates one example of a schematic plan view of a substrate comprising electrodes which is used in the present invention. The substrate 10 illustrated in FIG. 1 has a solder resist in a region 11 outside the upper surface electrodes 12, and the electrodes 12 are composed of an electrode (group) 12a around the substrate periphery and an electrode (group) 12b in the substrate central region.

(Solder Bump Formation Method)

The solder bump formation method of the fourth embodiment of the present invention comprises:

(A) a step of mounting the reflow film on an electrode surface side of a substrate comprising electrodes, (B) a step of mounting and fixing a flat plate to the reflow film, (C) a step of heating at a temperature of melting temperature of the solder particles in the reflow film or higher, and at a temperature of liquefying the thermoplastic resin of higher, and (D) a step of dissolving and removing the reflow film after completion of the step (C).

Meanwhile, when the reflow film is the reflow film of the second embodiment, the heating in the step (C) is conducted at a temperature of melting the solder particles in the reflow film or higher, and at a temperature of liquefying the polyvinyl alcohol and the aforementioned low-molecular weight component or higher.

Figure 2:
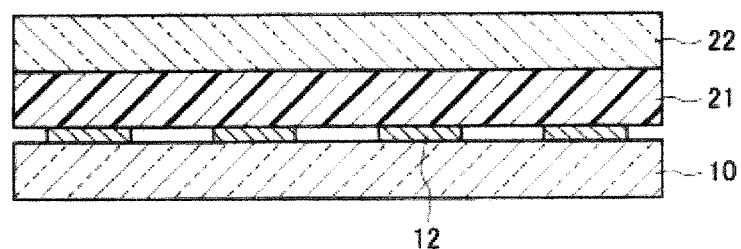
FIG. 2 illustrates one example of a solder bump formation method, wherein (a) is a cross-sectional view of a substrate on which a reflow film and a flat plate are mounted, (b) is a cross-sectional view illustrating a state in which the solder is accumulated on the electrodes after heating step, and (c) is a cross-sectional view illustrating a state in which the solder bumps is exposed after dissolution and removal by solvent washing.
Figure 2:
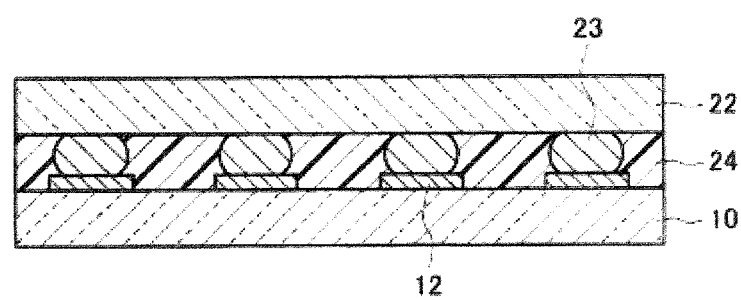
Figure 2:
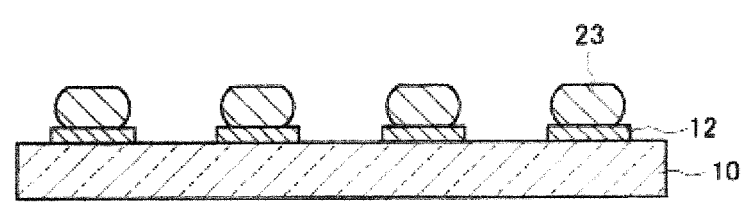

FIGS. 2(a) to 2(c) show examples of cross-sectional views of a substrate illustrating the bump formation method of the fourth embodiment. FIG. 2(a) illustrates the state in step (B) where a reflow film 21 is mounted on the surface side of the electrodes 12 of the substrate 10, and a flat plate 22 is mounted on the reflow film. FIG. 2(b) is a cross-sectional view illustrating the state where solder bumps 23 are accumulated on the electrodes 12 after the heating step (C). FIG. 2(c) is a cross-sectional view illustrating the state where the flat plate 22 is removed, and the reflow film 24 containing the solder residue is removed to expose the solder bumps 23 after step (D).

(Step (A) of Mounting the Reflow Film)

The reflow film is mounted on the electrode surface side of the substrate comprising the electrodes. There are no particular limitations on the mounting method. As described above, the substrate is preferably degreased in advance. In order to ensure that water adsorbed to the substrate does not cause foaming during the heating step, the substrate is preferably dried by heating at 120° C. for approximately 4 hours.

(Step (B) of Mounting Flat Plate)

The flat plate used in this step (B) must have a flat surface shape, and also requires sufficient heat resistance to withstand the heating step. Moreover, it is preferable that when the flat plate is removed from the reflow film during the subsequent step (D), the entire upper surface of the reflow film can make contact with the solvent, thereby enabling the resin to dissolve more rapidly. An example of a flat plate that satisfies the above requirements is a glass plate made of an Eagle glass that exhibits good heat resistance and low thermal expansion.

Further, in this step (B), because there is a possibility that the flat plate may move due to the evaporation of a trace amount of low-boiling point components during the subsequent heating step, the flat plate is preferably fixed with a jig such as a clamp after mounting. Furthermore, in order to obtain solder bumps of the desired height, it is preferable that spacers equivalent to the solder bump height are sandwiched between the substrate and the flat plate as required. In order to minimize fluctuation in the height of the solder bumps, the flat plate is preferably positioned parallel relative to the substrate, and this state is preferably maintained during step (C).

(Step (C) of Heating)

The heating temperature and the heating time (holding time) of step (C) can be determined appropriately in accordance with conditions such as the temperature equal to or higher than a temperature of melting the solder particles being used, the temperature equal to or higher than a temperature of liquefying the resin, the amount of the solder particles, the viscosity of the resin during the heating step, the boiling point of the flux agent, the size of the substrate electrodes, and the pitch between the substrate electrodes. For example, in the case of Sn-3Ag-0.5Cu which has a solder melting point of approximately 217° C., the heating may be performed at 260° C. for approximately 1 minute.

Further, if necessary, heating may be performed in a state where pressure is applied from the flat plate toward the substrate. Applying pressure activates the flow of the solder particles and has the effect of promoting the self-assembly of the solder particles on the electrodes, and is therefore preferred. If excessive pressure is applied, then large amounts of the resin and the solder particles tend to be forced outside the flat plate, and therefore the level of pressure is selected appropriately so as to suppress such excessive outflow, and ensure maintenance of the desired solder bump height.

Furthermore, as described above, in order to prevent the network formation as a result of condensation reactions or the like, this step is preferably conducted under an inert gas atmosphere.

When this step (C) is completed, the solder component becomes localized on the substrate electrodes as a result of self-assembly, whereas the resin component of the film is localized in the regions between the flat plate and the substrate outside of the electrode regions.

(Step (D) of Dissolving and Removing the Resin)

The reflow film containing solder residue that exists between the flat plate and the substrate outside of the electrodes can be washed with a variety of solvents, but as described above, it is preferable that dissolution and removal of the resin component is performed by washing with water, an alcohol, or a mixed solvent thereof. Regarding washing temperature, provided the resin component can be removed at room temperature, the washing is preferably performed at room temperature. If the resin is difficult to dissolve or dissolution requires a long period of time, then the washing solvent may be heated to perform the washing. In such cases, increasing the temperature improves the ease with which the resin can be dissolved, but the washing must be performed at a temperature lower than the solvent boiling point. Further, when the resin is difficult to dissolve, ultrasonic waves may be irradiated, either during the washing process or before or after washing, at a level that ensures no decomposition of the accumulated solder bumps.

When this step (D) is completed, the reflow film containing the solder residue that existed between the substrate and the flat plate in the regions outside the electrodes is removed, and the flat plate is also removed from the solder bumps, leaving the solder bumps formed on the electrodes.

(Solder Joint Formation Method)

The solder joint formation method of the fifth embodiment of the present invention comprises:

(a) a step of mounting the reflow film on an electrode surface side of a substrate comprising electrodes, (b) a step of mounting an electrode surface side of another substrate comprising electrodes on the reflow film, and fixing the substrates in positions where the electrodes of the upper and lower substrates oppose one another across the reflow film, (c) a step of heating, in a state described above in (b), at a temperature of melting the solder particles in the reflow film or higher, and at a temperature of liquefying the thermoplastic resin or higher, and (d) a step of dissolving and removing the reflow film after completion of the step (c).

Meanwhile, when the reflow film is the reflow film of the second embodiment, the heating in the step (c) is conducted at a temperature of melting the solder particles in the reflow film or higher, and at a temperature of liquefying the polyvinyl alcohol and the aforementioned low-molecular weight component or higher.

When the step (c) is completed, the solder component becomes localized between the opposing electrodes on the substrates as a result of self-assembly, thereby joining the opposing electrodes via the solder, whereas the resin component of the film is localized between the substrates outside of the regions between the opposing electrodes. Further, when the step (d) is completed, the reflow film containing the residue solder that exists between the substrates outside of the regions between the opposing electrodes is removed, and the solder that joins the opposing electrodes are exposed.

The solder joint formation method of the present invention does not require a step of placing solder balls on the substrate electrodes, and enables solder joints to be formed by the simple process of washing away and removing the reflow film containing residual solder that can cause short-circuits by using a solvent.

Figure 4:
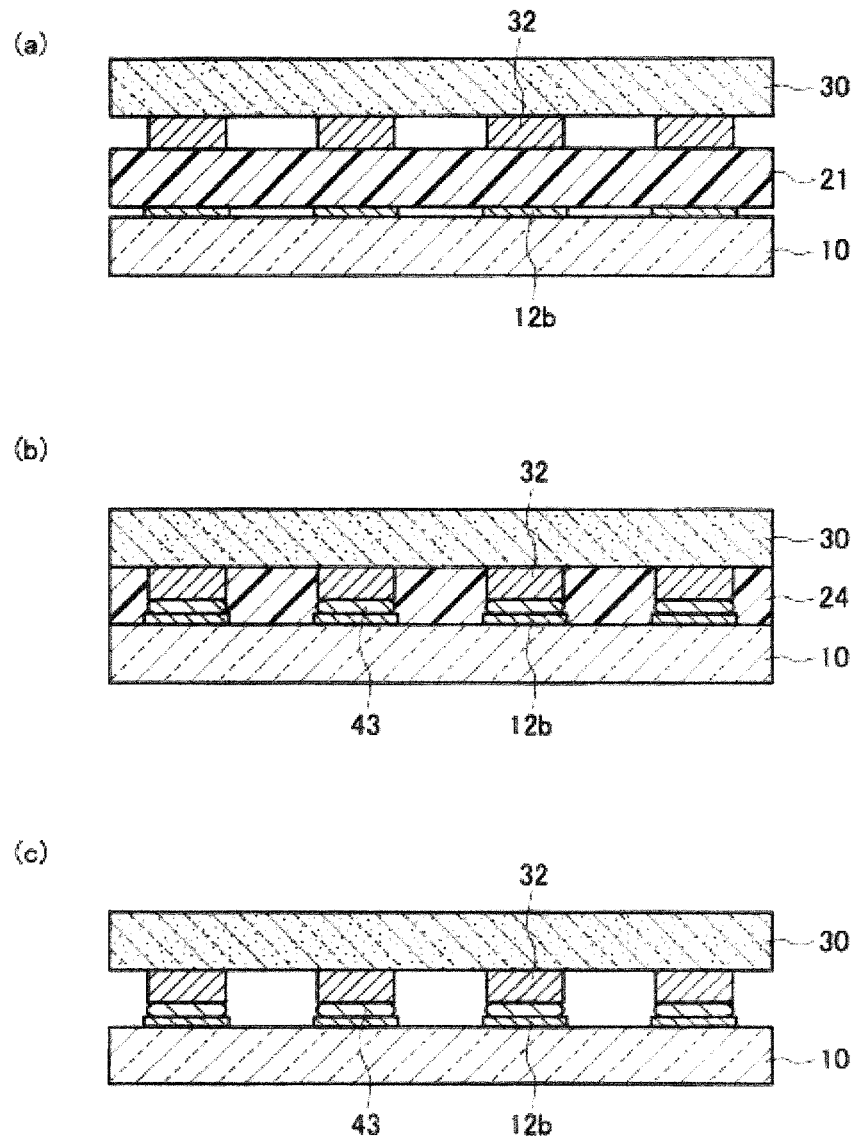
FIG. 4 illustrates one example of a solder joint formation method for forming a solder joint between opposing electrodes when an interposer, a reflow film and a semiconductor chip are stacked together, wherein (a) is a cross-sectional view illustrating a state in which the reflow film is mounted on the substrate, and the electrode (copper pillar) side of the semiconductor chip is then stacked on the reflow film, (b) is a cross-sectional view illustrating a state in which the opposing electrodes are joined with solder after heating step, and (c) is a cross-sectional view illustrating a state in which the solder joints between the opposing electrodes are exposed after dissolution and removal by a solvent.

FIG. 4 is a series of cross-sectional views illustrating one example of the method of forming solder joints between opposing electrodes. FIG. 4(a) illustrates a state in which a reflow film 21 is mounted on the electrode 12b side of a substrate 10, and the electrode 32 (copper pillar) side of a semiconductor chip 30 is then mounted on the reflow film. FIG. 4(b) illustrates a state in which the opposing electrodes 32 and 12b are joined with solder joint regions 43 after the heating step. FIG. 4(c) illustrates astute in which the solder joint regions 43 between the opposing electrodes 32 and 12b are exposed after removal of the reflow film 24 containing the solder residue.

(Step (a) of Mounting Reflow Film)

In the solder joint formation method of the present invention, the step (a) is performed on the electrode surface side of the substrate where the electrodes are provided, in the same manner as that described for the aforementioned step (A).

(Step (b) of Positioning Electrodes in Opposition with Those of Another Substrate)

The another substrate comprising electrodes may be the same type of substrate as the aforementioned substrate, or a different type of substrate, and the combination of the two substrates is preferably a combination of a semiconductor chip and an interposer, a semiconductor chip and a semiconductor chip, or an interposer and an interposer.

In order to achieve the desired distance between the electrodes, it is preferable that spacers equivalent to the distance between the electrodes are sandwiched between the upper and lower substrates as required. In order to minimize fluctuation, the upper and lower substrates are preferably positioned in parallel, and this state is preferably maintained during the subsequent heating step.

Because there is a possibility that the top-mounted substrate may move due to the evaporation of a trace amount of low-boiling point components during the subsequent heating step, the substrates are preferably fixed with a jig such as a clamp after mounting.

(Step (c) of Heating)

In the heating step in the solder joint formation method of the present invention, the heating temperature and the heating time (holding time) can be determined appropriately in accordance with conditions such as the temperature equal to or higher than a temperature of melting the solder particles being used, the temperature equal to or higher than a temperature of liquefying the resin, the amount of the solder particles, the viscosity of the resin during the heating step, the boiling point of the flux agent, the size of the substrate electrodes, the pitch between the electrodes, and the distance between the opposing electrodes.

Further, in the same manner as that described above for the step (C), the step (c) of heating is preferably conducted under an inert gas atmosphere, and may be performed in a state in which pressure has been applied.

(Step (d) of Dissolving and Removing the Resin)

The reflow film containing solder residue that exists between the substrates outside of the regions between the opposing electrodes can be dissolved and removed in the same manner as that described above for the step (D). Further, when the resin is difficult to dissolve, ultrasonic irradiation may be performed in a similar manner to that described above.

(Solder Joint Regions)

By using the solder joint formation method described above, solder joint regions are formed between the opposing electrodes of the two substrates comprising the electrodes. Because the reflow film does not contain a convection additive, foaming unlikely occurs during the reflow process, resulting in minimal incorporation of voids in the solder joint regions. Further, because the inside of the solder joint regions contains no thermosetting resin component, even if voids are generated in the solder joint regions, the voids are able to be released from the solder joint regions. As a result, the amount of voids inside the solder joint regions can be reduced.

Furthermore, as described above, the aforementioned solder joint regions do not contain a resin component, and therefore exhibit low electrical resistance, which is preferable for a joint material from the viewpoint of electrical resistance. Further, because the solder joint regions contain minimal voids, cracking caused by heat shock unlikely occurs, which is preferable for a joint material from the viewpoint of connection reliability.

(Semiconductor Device)

In a semiconductor device having solder joint regions of the present invention, in those cases where the combination of substrates comprising electrodes that are connected via the solder joint regions is a combination of a semiconductor chip and an interposer, a semiconductor chip and a semiconductor chip, or an interposer and an interposer, the semiconductor device of the present invention exhibits low electrical resistance and high connection reliability. Further, this semiconductor device is formed by a simple process using the reflow film of the present invention, and therefore offers the advantage of being simple to produce. Moreover, electronic component devices other than semiconductor devices can also be produced in a similar manner.

Figure 5:
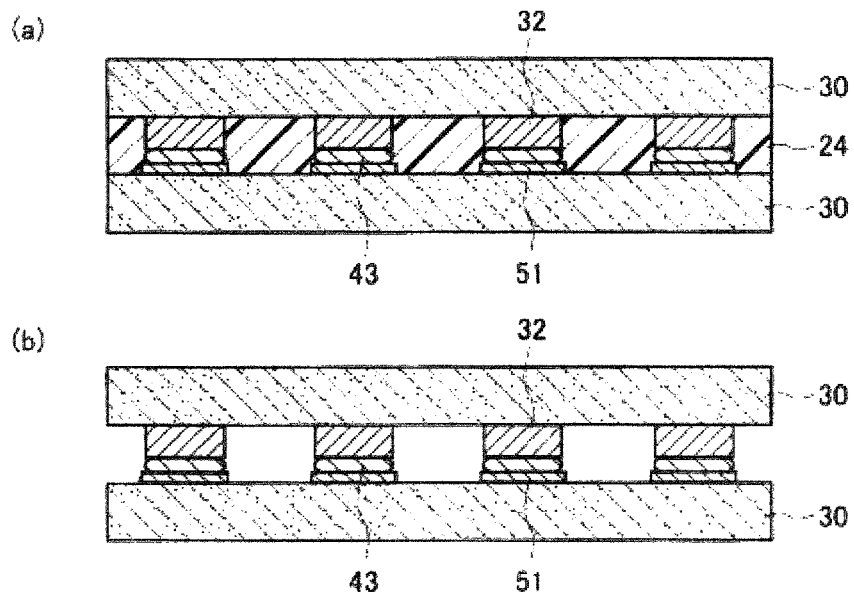
FIG. 5 illustrates one example of a solder joint formation method for forming a solder joint between opposing electrodes when a semiconductor chip, a reflow film and another semiconductor chip are stacked together, wherein (a) is a cross-sectional view illustrating a state in which the opposing electrodes are joined with solder after heating step, and (b) is a cross-sectional view illustrating a state in which the solder joints between the opposing electrodes are exposed after dissolution and removal by solvent washing.

FIG. 5 illustrates one example of a solder joint formation method for substrates in which a semiconductor chip 30, a reflow film and another semiconductor chip 30 are stacked together, wherein (a) is a cross-sectional view illustrating a state in which the opposing electrodes 32 and 51 are joined with solder joint regions 43 after the heating step, and (b) is a cross-sectional view illustrating a state in which the solder joint regions 43 between the opposing electrodes 32 and 51 are exposed after removal of the reflow film 24 containing solder residue.

Figure 6:
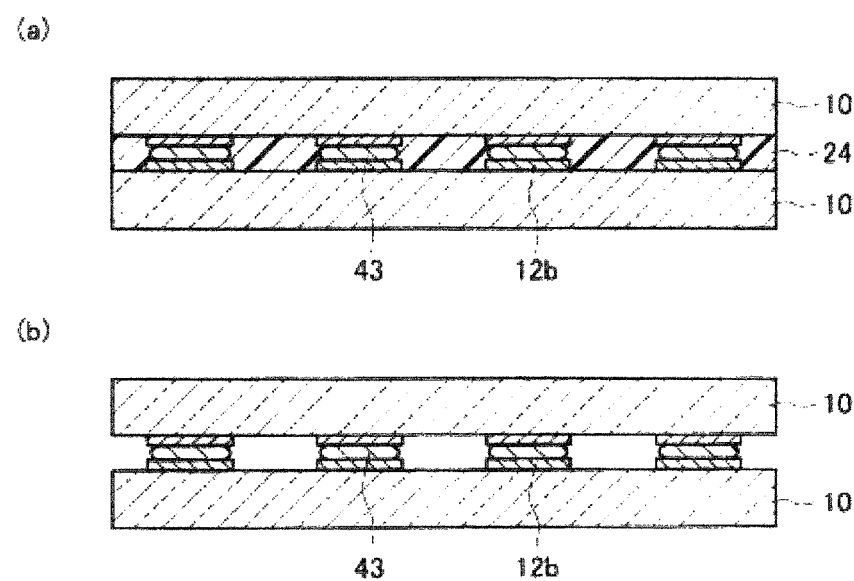
FIG. 6 illustrates one example of a solder joint formation method when an interposer, a reflow film and another interposer are stacked together, wherein (a) is a cross-sectional view illustrating a state in which the opposing electrodes are joined with solder after heating step, and (b) is a cross-sectional view illustrating a state in which the solder joints between the opposing electrodes are exposed after dissolution and removal by solvent washing.

FIG. 6 illustrates one example of a solder joint formation method for substrates in which an interposer 10, a reflow film and another interposer 10 are stacked together, wherein (a) is a cross-sectional view illustrating a state in which the opposing electrodes 12b are joined with solder joint regions 43 after the heating step, and (b) is a cross-sectional view illustrating a state in which the solder joint regions 43 between the opposing electrodes 12b are exposed after removal of the reflow film 24 containing solder residue.

(Solder Bumps)

The solder bumps of the present invention formed using the aforementioned solder bump formation method are formed by accumulation of only the solder component on the electrodes by the process of self-assembly. In conventional solder pastes containing a convection additive and a resin component, there is a concern that the viscosity of the resin component may increase with heating, making it impossible for voids to be released. Compared with solder bumps obtained from this type of solder paste, the solder bumps of the present invention have a reduced amount of voids caused by gas bubble generation and incorporation.

Further, because the reflow film is held in the space sandwiched between the substrate and the flat plate, the height (thickness) of the formed solder bumps is regulated. That is, the solder bumps formed on the electrodes are unable to grow higher than the surface where the flat plate contacts the reflow film. As a result, the solder bumps can be formed with a desired height, and any fluctuation in the height of the solder bumps is minimal.

(Substrate with Solder Bumps)

The substrate with solder bumps of the present invention, which is formed using the solder bump formation method described above, is preferable as the joint material from the viewpoint of electrical resistance. This is because in the joints using the substrate with solder bumps, the solder bumps contain no resin component, and therefore exhibit low electrical resistance. Further, the substrate with solder bumps of the present invention is also preferable as a joint material from the viewpoint of connection reliability. This is because, as mentioned above, the solder bumps contain minimal voids, therefore cracking due to heat shock unlikely occurs. Moreover, the substrate with solder bumps also offers the advantage that it can be produced by a simple process using the reflow film of the present invention.
(Solder Joints Generated by Reflow Between Solder Bumps and Electrodes)

By mounting the substrate with solder bumps obtained using the fourth embodiment of the present invention described above on another substrate comprising electrodes, and then performing reflow, solder joints can be formed between the substrates.

That is, the solder joint formation method which uses a substrate with solder bumps prepared by forming bumps on the electrodes of a substrate using the solder bump formation method described above, comprises:

(E) a step of applying a component for removing metal compounds to at least one of the solder bumps of the substrate with solder bumps, and the electrodes of another substrate comprising electrodes which is to be connected to the substrate with solder bumps, (F) a step of either mounting the electrode surface side of the other substrate on the solder bumps of the substrate with solder bumps, or mounting the solder bumps side of the substrate with solder bumps on the electrodes of the other substrate, so that the electrodes of the upper and lower substrates oppose one another, and (G) step of heating, in the opposing state described above in (F), at a temperature of melting the solder bumps or higher.

One example of this solder joint formation method is described below.
(Step (E) of Applying Flux Agent)

First, another substrate comprising electrodes which is to be connected to the substrate with solder bumps is prepared, and a component for removing metal compounds is applied to at least one of the solder bumps of the substrate with solder bumps, and the electrodes of the other substrate.

The flux agents as mentioned above can be used as the flux agent, and examples of preferred flux agents and the reasons for those preferences are the same as described above. These flux agents may be used in unchanged form in the case of a liquid, or dissolved in a solvent such as an alcohol prior to use in the case of a solid. Further, commercially available flux agents of controlled viscosity may also be used. The optimum coating amount of the flux agent varies depending on factors such as the size and surface area of the solder bumps, and the thickness of the oxide film on the surface of the solder particles, and may be determined as appropriate.
(Step (F) of Mounting the Substrate)

Next, the electrode surface side of the aforementioned other substrate is mounted on the solder bumps of the substrate with solder bumps, or the solder bumps side of the substrate with solder bumps is mounted on the electrodes of the other substrate.

That is, either the electrode surface side of the substrate that is to be connected to the substrate with bumps is mounted on the bumps of the substrate with bumps, or the bumps of the substrate with bumps are mounted on the electrodes of the substrate that is to be connected. At this time, the positions of the upper and lower substrates are preferably adjusted so that the upper and lower electrodes oppose each other across the bumps. The positional relationship between the substrate with bumps and the substrate that is to be connected may have either of the substrates positioned on top.

(Step (G) of Performing Reflow)

After positioning of the electrodes of the two substrates in the aforementioned step (F), heating (reflow) is performed at a temperature of melting the solder bumps. The heating may also be performed in a state where pressure is applied to the substrates. By subsequently returning the temperature to room temperature, solder joints can be formed between the two substrates. This forms solder joint regions between the opposing electrodes of the two substrates comprising electrodes.
(Washing of Substrate)

After the reflow step, the substrates are preferably washed with distilled water or ion-exchanged water to remove any residual flux agent. This is because if any flux agent remains, then it can cause corrosion of the solder joint regions, and result in a reduction in the reliability of the device upon long-term use.
(Semiconductor Device)

When the substrate with solder bumps of the present invention is a semiconductor chip or an interposer, a semiconductor device of the present invention comprising a semiconductor chip with solder bumps and an interposer, a semiconductor chip with solder bumps and another semiconductor chip, an interposer with solder bumps and a semiconductor chip, or an interposer with solder bumps and another interposer mounted together exhibits low electrical resistance and superior connection reliability. Further, because this semiconductor device can be produced using a substrate with solder bumps formed by a simple process using the reflow film of the present invention, it offers the advantage of being simple to produce.

Figure 7:
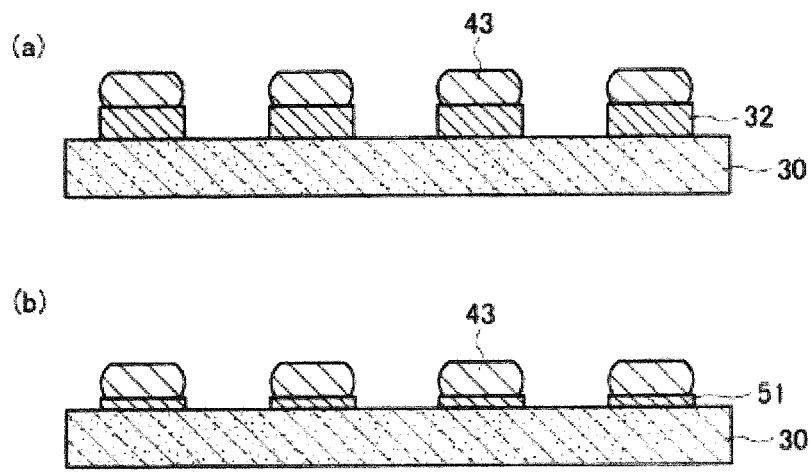
FIG. 7 is a cross-sectional view illustrating solder bumps formed on the electrodes of a substrate (semiconductor chip) after dissolution and removal by solvent washing in a solder bump formation method, wherein (a) illustrates an example in which the electrodes are copper pillars, and (b) illustrates an example in which the electrodes are gold bumps.

FIG. 7 is a cross-sectional view illustrating solder bumps 43 formed on the electrodes of a substrate (semiconductor chip) 30 after dissolution and removal by solvent washing in the solder bump formation method, wherein (a) illustrates an example in which the electrodes are copper pillars 32, and (b) illustrates an example in which the electrodes are gold bumps 51.

Figure 8:
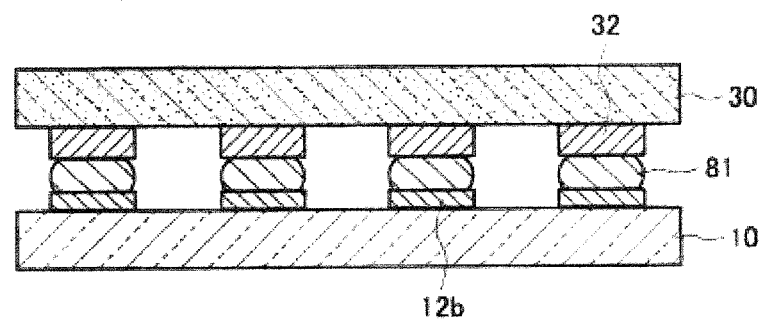
FIG. 8 is a cross-sectional view illustrating a state in which an interposer and a semiconductor chip (electrodes: copper pillars) are joined with solder using an interposer with solder bumps or a semiconductor chip with solder bumps.

FIG. 8 is a cross-sectional view illustrating a state in which an interposer 10 and a semiconductor chip 30 (electrodes: copper pillars 32) are joined with solder joint regions 81 using an interposer with solder bumps or a semiconductor chip with solder bumps.

Figure 9:
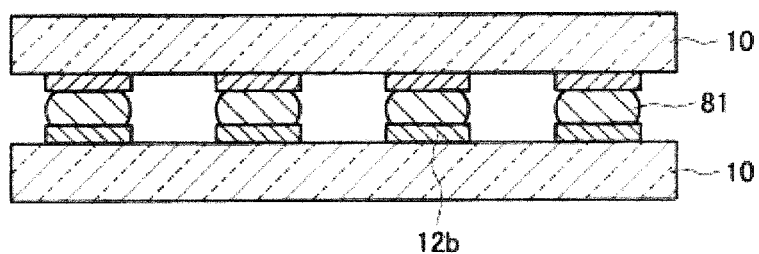
FIG. 9 is a cross-sectional view illustrating a state in which an interposer and another interposer are joined with solder using an interposer with solder bumps.

FIG. 9 is a cross-sectional view illustrating a state in which an interposer 10 and another interposer 10 are joined with solder joint regions 81 using an interposer with solder bumps.

Figure 10:
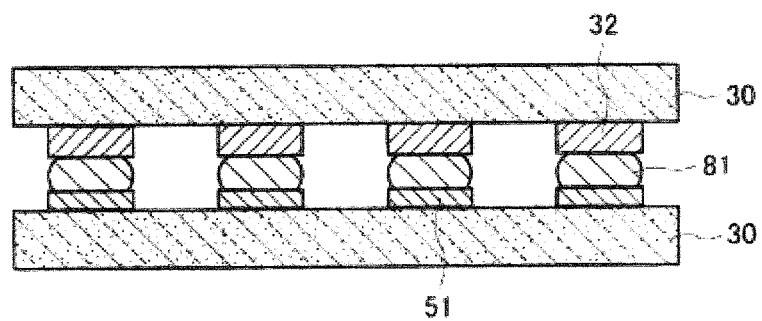
FIG. 10 is a cross-sectional view illustrating a state in which a semiconductor chip with solder bumps (electrodes: gold bumps) are joined with solder to another semiconductor chip (electrodes: copper pillars).

FIG. 10 is a cross-sectional view illustrating a state in which a semiconductor chip 30 with solder bumps (electrodes: gold bumps 51) and another semiconductor chip 30 (electrodes: copper pillars 32) are joined with solder joint regions 81.

EXAMPLES

The present invention is described below in further detail using a series of examples, but the present invention is in no way limited by the following examples.

Example 1

<Preparation of Varnish>

A polyvinyl alcohol (PVA) ("Gohsenol" (a registered trademark) GL-03, manufactured by The Nippon Synthetic Chemical Industry Co., Ltd.; saponification degree: 86.5 to 89.0 mol %, viscosity: 3.0 to 3.7 mPa·s) was dissolved in distilled water to prepare an aqueous solution, and solder particles ("Solder Powder Sn96.5Ag3Cu0.5" manufactured by Mitsui Mining & Smelting Co., Ltd., composition: Sn 96.5 mol %, Ag 3 mol %, Cu 0.5 mol %, particle size: 20 to 38 μm (these values indicate the particle size, within the cumulative particle size distribution of all the particles, at a cumulative value of 10% from the fine particle end of the distribution, and the particle size at a cumulative value of 90%, meaning that the proportion of particles having a particle size smaller than 20 μm is 10%, the proportion of particles having a particle size exceeding 38 μm is 10%, and the proportion of particles having a particle size of 20 to 38 μm is 80%, this definition also applies below)) were then added to the aqueous solution and mixed, thus preparing a varnish comprising 100 parts by mass of the polyvinyl alcohol and 150 parts by mass of the solder particles.

<Preparation of Film>

The above varnish was applied to a polyethylene terephthalate film (support), the surface of which was subjected to a release treatment, thus obtaining a coating film. This coating film was dried by heating at 120° C. for 1 hour, thus forming a reflow film of Example 1 with a thickness of 100 μm on top of the support. The compositions of the reflow films of each of the Examples and Comparative Examples are shown in Tables 1 to 3. In the tables, "phr" indicates the amount of a component added with respect to 100 parts by mass of the thermoplastic resin.

Example 2

<Preparation of Varnish>

Solder particles ("Solder powder Sn96.5Ag3Cu0.5" manufactured by Mitsui Mining & Smelting Co., Ltd., as described above) were added to a methanol solution of salicylic acid, and the oxide film on the solder particles was dissolved over a period of 10 minutes. Subsequently, the methanol solution of salicylic acid containing the immersed solder was added to and mixed with an aqueous solution containing distilled water and a polyvinyl alcohol (PVA) (product name: "Gohsenol" (a registered trademark) GL-05, manufactured by The Nippon Synthetic Chemical Industry Co., Ltd., saponification degree: 86.5 to 89.0 mol %, viscosity: 4.8 to 5.8 mPa·s), thus preparing a varnish comprising 100 parts by mass of the polyvinyl alcohol, 150 parts by mass of the solder particles, and 5 parts by mass of salicylic acid.

<Preparation of Film>

A film was prepared in accordance with the method of Example 1.

Example 3

<Preparation of Varnish>

With the exception of increasing the amount of salicylic acid used in the preparation of the varnish of Example 2 to 10 parts by mass, a varnish was prepared in accordance with the method of Example 2.

<Preparation of Film>

A film was prepared in accordance with the method of Example 1.

Example 4

<Preparation of Varnish>

With the exceptions of replacing the type of polyvinyl alcohol used in the preparation of the varnish of Example 2 by using a product "L-7514" (saponification degree: 34.0 to 41.0 mol %) instead of "GL-05", and using a mixed solvent of methanol/distilled water=1/1 (mass ratio) instead of distilled water as the solvent for dissolving the polyvinyl alcohol, a varnish was prepared in accordance with the method of Example 2.

<Preparation of Film>

A film was prepared in accordance with the method of Example 1.

Example 5

<Preparation of Varnish>

With the exception of using a polyvinylpyrrolidone (PVP) (product name: "K-30", manufactured by Nippon Shokubai Co., Ltd.) instead of the polyvinyl alcohol (PVA) in the preparation of the varnish of Example 2, a varnish was prepared in accordance with the method of Example 2.

<Preparation of Film>

A film was prepared in accordance with the method of Example 1.

Example 6

<Preparation of Varnish>

With the exceptions of replacing the type of solder particles used in the preparation of the varnish of Example 2 by using a product "Solder Powder ST-5" manufactured by Mitsui Mining & Smelting Co., Ltd. (composition: Sn 96.5 mol %, Ag 3 mol %, Cu 0.5 mol %, particle size: 2.7 to 7.8 μm) instead of the "Solder Powder Sn96.5Ag3Cu0.5", and performing operations inside a glove box under a nitrogen atmosphere, a varnish was prepared in accordance with the method of Example 2.

<Preparation of Film>

A film was prepared inside a glove box under a nitrogen atmosphere, in accordance with the method of Example 1.

Example 7

<Preparation of Varnish>

With the exception of replacing the type of solder particles used in the preparation of the varnish of Example 2 by using a product "Solder Powder Sn42Bi58" manufactured by Mitsui Mining & Smelting Co., Ltd. (composition: Sn 42 mol %, B±58 mol %, particle size: 20 to 38 μm) instead of the "Solder Powder Sn96.5Ag3Cu0.5", a varnish was prepared in accordance with the method of Example 2.

<Preparation of Film>

A film was prepared in accordance with the method of Example 1.

Example 8

<Preparation of Varnish>

With the exception of increasing the amount of solder particles used in the preparation of the varnish of Example 2 from 150 parts by mass to 300 parts by mass, a varnish was prepared in accordance with the method of Example 2.

<Preparation of Film>

A film was prepared in accordance with the method of Example 1.

Example 9

<Preparation of Varnish>

In the preparation of the varnish of Example 1, glycerol was also mixed into the varnish to prepare a varnish containing 100 parts by mass of the polyvinyl alcohol, 150 parts by mass of the solder particles, and 40 parts by mass of glycerol.
<Preparation of Film>
With the exception of altering the drying conditions for the coating film in the preparation of the film of Example 1 to "90° C. for 1 hour", a film was prepared in accordance with the method of Example 1.

Example 10

<Preparation of Varnish>
In the preparation of the varnish of Example 2, glycerol was also mixed into the varnish to prepare a varnish containing 100 parts by mass of the polyvinyl alcohol, 150 parts by mass of the solder particles, 40 parts by mass of glycerol, and 5 parts by mass of salicylic acid.
<Preparation of Film>
A film was prepared in accordance with the method of Example 9.

Example 11

<Preparation of Varnish>
With the exception of increasing the amount of salicylic acid used in the preparation of the varnish of Example 10 to 10 parts by mass, a varnish was prepared in accordance with the method of Example 10.
<Preparation of Film>
A film was prepared in accordance with the method of Example 9.

Example 12

<Preparation of Varnish>
With the exception of increasing the amount of glycerol used in the preparation of the varnish of Example 11 to 100 parts by mass, a varnish was prepared in accordance with the method of Example 11.
<Preparation of Film>
A film was prepared in accordance with the method of Example 9.

Example 13

<Preparation of Varnish>
With the exceptions of replacing the type of polyvinyl alcohol (PVA) used in the preparation of the varnish of Example 11 by using a product "Gohsefimer (a registered trademark) L-7514", which is a low-saponification degree product manufactured by The Nippon Synthetic Chemical Industry Co., Ltd. (saponification degree: 34.0 to 41.0 mol %) instead of "GL-05", and using a mixed solvent of methanol/distilled water=1/1 (mass ratio) instead of distilled water as the solvent for dissolving the polyvinyl alcohol, a varnish was prepared in accordance with the method of Example 11.
<Preparation of Film>
A film was prepared in accordance with the method of Example 9.

Example 14

<Preparation of Varnish>
With the exceptions of replacing the type of solder particles used in the preparation of the varnish of Example 11 by using a product "Solder Powder ST-5" manufactured by Mitsui Mining & Smelting Co., Ltd. (composition: Sn 96.5 mol %, Ag 3 mol %, Cu 0.5 mol %, particle size: 2.7 to 7.8 μm) instead of the "Solder Powder Sn96.5Ag3Cu0.5"

(described above), and performing operations inside a glove box under a nitrogen atmosphere, a varnish was prepared in accordance with the method of Example 11.
<Preparation of Film>
A film was prepared inside a glove box under a nitrogen atmosphere, in accordance with the method of Example 9.

Example 15

<Preparation of Varnish>
With the exception of replacing the type of solder particles used in the preparation of the varnish of Example 11 by using a product "Solder Powder Sn42Bi58" manufactured by Mitsui Mining & Smelting Co., Ltd. (composition: Sn 42 mol %, B±58 mol %, particle size: 20 to 38 μm) instead of the "Solder Powder Sn96.5Ag3Cu0.5" (described above), a varnish was prepared in accordance with the method of Example 11.
<Preparation of Film>
A film was prepared in accordance with the method of Example 9.

Example 16

<Preparation of Varnish>
With the exception of increasing the amount of solder particles used in the preparation of the varnish of Example 11 from 150 parts by mass to 300 parts by mass, a varnish was prepared in accordance with the method of Example 11.
<Preparation of Film>
A film was prepared in accordance with the method of Example 9.
(Average Polymerization Degree of Polyvinyl Alcohol)
Among the commercially available polyvinyl alcohols used in Examples 17 to 27, for "Poval" (a registered trademark), which is a polyvinyl alcohol manufactured by Kuraray Co., Ltd., the listed catalog value for the average polymerization degree measured in accordance with JIS K 6726 (Testing methods for polyvinyl alcohol) was used as the average polymerization degree. For the product numbers "GL-03", "GL-05" and "KL-03" of the "Gohsenol" (a registered trademark), and the product numbers "L-7514" and "L-5407" of the product "Gohsefimer" (a registered trademark), which are polyvinyl alcohols manufactured by The Nippon Synthetic Chemical Industry Co., Ltd., values for the polymerization degree measured in accordance with the aforementioned JIS K 6726 (Testing methods for polyvinyl alcohol) were used as the average polymerization degree.
Further, the viscosity values for the aforementioned "GL-03", "GL-05" and "KL-03" represent the viscosity measured in accordance with JIS K 6726 (Testing methods for polyvinyl alcohol) under conditions where "a B-type viscometer was used at 20° C. for a 4% by mass aqueous solution of the polyvinyl alcohol", whereas the viscosity values for the "L-7514" and "L-5407" used in Examples 22 and 23 represent the viscosity of a 10% by mass solution of the polyvinyl alcohol in a mixed solvent of water/methanol with a mass ratio of 1/1, measured at 20° C. using a Hepler viscometer.

Example 17

<Preparation of Varnish>
A varnish was prepared in accordance with the method of Example 1. The average polymerization degree obtained from the polyvinyl alcohol "Gohsenol (a registered trademark) GL-03" manufactured by The Nippon Synthetic Chemical Industry Co., Ltd. (saponification degree: 86.5 to 89.0 mol %, viscosity: 3.0 to 3.7 mPa·s) used in this example was 300.

<Preparation of Film>

With the exception of altering the drying conditions for the coating film in the film preparation method of Example 1 to "drying by heating at 100° C. for 1 hour, followed by further drying by heating at 120° C. for 1 hour", a film was prepared in accordance with the method of Example 1.

Example 18

<Preparation of Varnish>

A varnish was prepared in accordance with the method of Example 2. The average polymerization degree obtained from the polyvinyl alcohol "Gohsenol (a registered trademark) GL-05" manufactured by The Nippon Synthetic Chemical Industry Co., Ltd. (saponification degree: 86.5 to 89.0 mol %, viscosity: 4.8 to 5.8 mPa·s) used in this example was 500.

<Preparation of Film>

A film was prepared in accordance with the method of Example 17.

Example 19

<Preparation of Varnish>

With the exception of replacing the type of polyvinyl alcohol used in the preparation of the varnish of Example 2 by using a product "Poval (a registered trademark) PVA-203" (saponification degree: 87.0 to 89.0 mol %, viscosity: 3.2 to 3.6 mPa·s, polymerization degree: 300) instead of the aforementioned "GL-05", a varnish was prepared in accordance with the method of Example 2.

<Preparation of Film>

A film was prepared in accordance with the method of Example 17.

Example 20

<Preparation of Varnish>

With the exception of replacing the type of polyvinyl alcohol used in the preparation of the varnish of Example 2 by using a product "Poval (a registered trademark) PVA-205" (saponification degree: 86.5 to 89.0 mol %, viscosity: 4.6 to 5.4 mPa·s, polymerization degree: 500) instead of the aforementioned "GL-05", a varnish was prepared in accordance with the method of Example 2.

<Preparation of Film>

A film was prepared in accordance with the method of Example 17.

Example 21

With the exception of replacing the type of polyvinyl alcohol used in the preparation of the varnish of Example 2 by using "KL-03" (saponification degree: 78.5 to 82.0 mol %, viscosity: 2.8 to 3.4 mPa·s) instead of "GL-05", a varnish was prepared in accordance with the method of Example 2. The average polymerization degree obtained from the KL-03 was 350.

<Preparation of Film>

A film was prepared in accordance with the method of Example 17.

Example 22

With the exceptions of replacing the type of polyvinyl alcohol used in the preparation of the varnish of Example 2 by using a product "Gohsefimer (a registered trademark) L-7514" (saponification degree: 34.0 to 41.0 mol %, viscosity: 20.0 to 28.0 mPa·s) instead of "GL-05", and using a mixed solvent of methanol/distilled water=1/1 (mass ratio) instead of distilled water as the solvent for dissolving the polyvinyl alcohol, a varnish was prepared in accordance with the method of Example 2.

The average polymerization degree obtained from the L-7514 was 600.

<Preparation of Film>

A film was prepared in accordance with the method of Example 17.

Example 23

<Preparation of Varnish>

With the exceptions of replacing the type of polyvinyl alcohol used in the preparation of the varnish of Example 2 by using a product "Gohsefimer (a registered trademark) L-5407" (saponification degree: 30.0 to 38.0 mol %, viscosity: 9.0 to 13.0 mPa·s) instead of "GL-05", and using a mixed solvent of methanol/distilled water=1/1 (mass ratio) instead of distilled water as the solvent for dissolving the polyvinyl alcohol, a varnish was prepared in accordance with the method of Example 2.

The average polymerization degree obtained from L-5407 was 200.

<Preparation of Film>

A film was prepared in accordance with the method of Example 17.

Example 24

<Preparation of Varnish>

With the exception of increasing the amount of salicylic acid used in the preparation of the varnish of Example 18 to 10 parts by mass, a varnish was prepared in accordance with the method of Example 18.

<Preparation of Film>

A film was prepared in accordance with the method of Example 17.

Example 25

<Preparation of Varnish>

With the exceptions of replacing the type of solder particles used in the preparation of the varnish of Example 18 by using a product "Solder Powder ST-5" manufactured by Mitsui Mining & Smelting Co., Ltd. (composition: Sn 96.5 mol %, Ag 3 mol %, Cu 0.5 mol %, particle size: 2.7 to 7.8 μm) instead of the "Solder Powder Sn96.5Ag3Cu0.5", and performing operations inside a glove box under a nitrogen atmosphere, a varnish was prepared in accordance with the method of Example 18.

<Preparation of Film>

A film was prepared inside a glove box under a nitrogen atmosphere, in accordance with the method of Example 17.

Example 26

<Preparation of Varnish>

With the exception of replacing the type of solder particles used in the preparation of the varnish of Example 18 by using a product "Solder Powder Sn42Bi58" manufactured by Mitsui Mining & Smelting Co., Ltd. (composition: Sn 42 mol %, Bi 58 mol %, particle size: 20 to 38 μm)

instead of the "Solder Powder Sn96.5Ag3Cu0.5", a varnish was prepared in accordance with the method of Example 18.
<Preparation of Film>
A film was prepared in accordance with the method of Example 17.

Example 27

<Preparation of Varnish>
With the exception of increasing the amount of solder particles used in the preparation of the varnish of Example 18 from 150 parts by mass to 300 parts by mass, a varnish was prepared in accordance with the method of Example 18.
<Preparation of Film>
A film was prepared in accordance with the method of Example 17.

Comparative Example 1

<Preparation of Paste>
A paste-like solder paste was prepared by blending 100 parts by mass of bisphenol F diglycidyl ether (product name: "Epiclon" (a registered trademark) EXA-830, manufactured by DIC Corporation, epoxy equivalent weight: 175 g/eq) as an epoxy resin, 0.5 parts by mass of 2-phenyl-4-methylimidazole (product name: "Curezol" (a registered trademark) 2P4MZ, manufactured by Shikoku Corporation) as a curing accelerator, 100 parts by mass of the aforementioned "Solder Powder Sn96.5Ag3Cu0.5" (particle size: 20 to 38 μm) as the solder particles, 5 parts by mass of sebacic acid as a flux agent, and 10 parts by mass of isopropyl alcohol as a convection additive.

Comparative Example 2

<Preparation of Varnish>
A varnish of Comparative Example 2 was prepared by adding 10 parts by mass of an acrylic rubber (product name: "HTR-860P-3", manufactured by Nagase ChemteX Corporation, containing 2 to 6% by mass of monomer units derived from glycidyl acrylate or glycidyl methacrylate) and 20 parts by mass of methyl ethyl ketone to the varnish of Comparative Example 1.
<Preparation of Film>
A film was prepared in accordance with the method of Example 1.

TABLE 1

| Example/ Comparative Example | Resin | Flux agent (phr) | Solder particles | | | Coating conditions | |
|---|---|---|---|---|---|---|---|
| | | | Composition | Particle size (μm) | Blend amount (phr) | Drying temperature and drying time | Sample state |
| Example 1 | PVA GL-03 | 0 | SnAgCu | 20 to 38 | 150 | 120° C. 1 hour | Film |
| Example 2 | PVA GL-05 | 5 | SnAgCu | 20 to 38 | 150 | | Film |
| Example 3 | PVA GL-05 | 10 | SnAgCu | 20 to 38 | 150 | | Film |
| Example 4 | PVA L-7514 | 5 | SnAgCu | 20 to 38 | 150 | | Film |
| Example 5 | PVP K-30 | 5 | SnAgCu | 20 to 38 | 150 | | Film |
| Example 6 | PVA GL-05 | 5 | SnAgCu | 2.7 to 7.8 | 150 | | Film |
| Example 7 | PVA GL-05 | 5 | SnBi | 20 to 38 | 150 | | Film |
| Example 8 | PVA GL-05 | 5 | SnAgCu | 20 to 38 | 300 | | Film |
| Comparative Example 1 | Epoxy | 5 | SnAgCu | 20 to 38 | 150 | 120° C. 1 hour | Paste |
| Comparative Example 2 | Epoxy | 5 | SnAgCu | 20 to 38 | 150 | | Film |

TABLE 2

| Example/ Comparative Example | Resin | Low-molecular weight component | | Flux agent (phr) | Solder particles | | | Coating conditions | |
|---|---|---|---|---|---|---|---|---|---|
| | | Type | (phr) | | Composition | Particle size (μm) | Blend amount (phr) | Drying temperature and drying time | Sample state |
| Example 9 | PVA GL-03 | Glycerol | 40 | 0 | SnAgCu | 20 to 38 | 150 | 90° C. 1 hour | Film |
| Example 10 | PVA GL-05 | Glycerol | 40 | 5 | SnAgCu | 20 to 38 | 150 | | Film |
| Example 11 | PVA GL-05 | Glycerol | 40 | 10 | SnAgCu | 20 to 38 | 150 | | Film |
| Example 12 | PVA GL-05 | Glycerol | 100 | 10 | SnAgCu | 20 to 38 | 150 | | Film |
| Example 13 | PVA L-7514 | Glycerol | 40 | 10 | SnAgCu | 20 to 38 | 150 | | Film |
| Example 14 | PVA GL-05 | Glycerol | 40 | 10 | SnAgCu | 2.7 to 7.8 | 150 | | Film |
| Example 15 | PVA GL-05 | Glycerol | 40 | 10 | SnBi | 20 to 38 | 150 | | Film |

TABLE 2-continued

| Example/ Comparative Example | Low-molecular weight component | | Flux agent (phr) | Solder particles | | | Coating conditions | Sample state |
|---|---|---|---|---|---|---|---|---|
| | Resin | Type | (phr) | | Composition | Particle size (μm) | Blend amount (phr) | Drying temperature and drying time | |
| Example 16 | PVA GL-05 | Glycerol | 40 | 10 | SnAgCu | 20 to 38 | 300 | | Film |

TABLE 3

| Example/ Comparative Example | Resin | Polymerization degree | Saponification degree (mol %) | Flux agent (phr) | Solder particles | | | Sample state |
|---|---|---|---|---|---|---|---|---|
| | | | | | Composition | Particle size (μm) | Blend amount (phr) | |
| Example 17 | GL-03 | 300 | 86.5 to 89 | 0 | SnAgCu | 20 to 38 | 150 | Film |
| Example 18 | GL-05 | 500 | 86.5 to 89 | 5 | SnAgCu | 20 to 38 | 150 | Film |
| Example 19 | PVA-203 | 300 | 87 to 89 | 5 | SnAgCu | 20 to 38 | 150 | Film |
| Example 20 | PVA-205 | 500 | 86.5 to 89 | 5 | SnAgCu | 20 to 38 | 150 | Film |
| Example 21 | KL-03 | 350 | 78.5 to 82 | 5 | SnAgCu | 20 to 38 | 150 | Film |
| Example 22 | L-7514 | 600 | 34 to 41 | 5 | SnAgCu | 20 to 38 | 150 | Film |
| Example 23 | L-5407 | 200 | 30 to 38 | 5 | SnAgCu | 20 to 38 | 150 | Film |
| Example 24 | GL-05 | 500 | 86.5 to 89 | 10 | SnAgCu | 20 to 38 | 150 | Film |
| Example 25 | GL-05 | 500 | 86.5 to 89 | 5 | SnAgCu | 2.7 to 7.8 | 150 | Film |
| Example 26 | GL-05 | 500 | 86.5 to 89 | 5 | SnBi | 20 to 38 | 150 | Film |
| Example 27 | GL-05 | 500 | 86.5 to 89 | 5 | SnAgCu | 20 to 38 | 300 | Film |

Coating conditions: (drying temperature, drying time) 100° C. for 1 hour+120° C. for 1 hour

[Solder Bump Formation]

<Mounting and Heating of Film or Paste>

Solder bumps were formed using the reflow films obtained in Examples 1 to 27 and the comparative samples of Comparative Examples 1 and 2. In the case of the film-like samples of Examples 1 to 27 and Comparative Example 2, the film was cut to an appropriate size. The resulting film-like sample was used to form solder bumps via the following process: (1) the film was placed on the electrode surface side of a substrate comprising electrodes described below, (2) a glass plate made of an Eagle glass having a high degree of heat resistance and low thermal expansion was placed on the film, pieces of a polyimide film having a thickness of 50 μm were sandwiched between the glass plate and the substrate as spacers at the two ends of the glass plate, and a bulldog clip was used to apply pressure from above and fix the glass plate, and (3) the film was then heated under a nitrogen atmosphere at a temperature of 260° C. for 1 minute, which represents a temperature of melting the solder particles or higher and a temperature of liquefying the film or higher. In the case of Example 7, Example 15 and Example 26 which used SnBi solder particles, only the heating temperature was altered, and heating was performed at 200° C.

Further, in the case of the paste-like sample of Comparative Example 1, an appropriate amount of the paste was dripped onto the electrode surface side of the substrate, a glass plate was then placed on top, and a load was applied to compress and spread the paste. The remaining steps were performed in the same manner as described above for the film-like samples.

<Substrate>

A schematic plan view of the substrate (interposer) used for forming solder bumps or solder joints in the Examples and Comparative Examples is shown in FIG. 1. The interposer used was an FR-4 substrate (glass epoxy substrate), the electrodes 12 were copper, and the UBM layer on the electrode surface was Cu/Ni/Au (thickness of Ni layer: 5 μm, thickness of Au layer: 0.05 μm). The electrode group was composed of an electrode (group) 12a around the substrate periphery and an electrode (group) 12b in the substrate central region. The electrode group 12b in the substrate central region consisted of 4 blocks, wherein the diameter of each electrode was 100 μm and the pitch between electrodes was 200 μm. Further, in the electrode group 12a around the substrate periphery, a diameter of electrodes was 1.5 mm and a pitch between electrodes was 3 mm. The region 11 outside of the electrodes on the upper surface of the substrate was composed of a solder resist.

The film-like samples of Examples 1 to 27 and Comparative Example 2 were each mounted on the electrode group in the substrate central region (electrode diameter: 100 μm, pitch between electrodes: 200 μm) or on the electrode group around the substrate periphery (electrode diameter: 1.5 mm, pitch between electrodes: 3 mm). Further, the paste-like sample of Comparative Example 1 was similarly applied to either the electrode group in the substrate central region (electrode diameter: 100 μm, pitch between electrodes: 200

μm) or the electrode group around the substrate periphery (electrode diameter: 1.5 mm, pitch between electrodes: 3 mm)

<Washing>

After the heating under a nitrogen atmosphere to effect self-assembly of the solder, each sample was immersed in distilled water that was heated to 80° C., and was washed for 10 minutes at 45 kHz using an ultrasonic washing device VS-100 Sunpar manufactured by Iuchi Co., Ltd. After washing, the flat plate was removed. In Example 4, Example 13, Example 22 and Example 23, a mixed solvent of methanol/water=1/1 (mass ratio) was used instead of the distilled water.

[Evaluation Methods]

<Workability>

Evaluations of the workability are shown in Tables 4 to 6. The film-like or paste-like sample was mounted or applied to a substrate 10 times, and the fluctuation in the amount mounted or the amount applied was calculated using a formula (1) shown below. When the fluctuation was less than 20%, an evaluation of A was recorded, when the fluctuation was more than 20% but less than 35%, B was recorded, and when the fluctuation was 35% or more, C was recorded. The larger the fluctuation in the mounted or applied mass, the more frequently the amount mounted or the amount applied must be adjusted, resulting in deterioration in the workability.

$$\text{Fluctuation in amount mounted (or applied)} = \{(W\text{max} - W\text{min})/W\text{av}\} \times 100 \quad \text{Formula (1)}$$

Wmax represents the maximum amount mounted or the maximum amount applied, Wmin represents the minimum amount mounted or the minimum amount applied, and Wav represents the average value for the amount mounted or the amount applied.

<Solder Self-Assembly>

In order to confirm the presence or absence of solder bump formation on the electrodes, each sample was inspected either visually or using a digital microscope VHX-200 manufactured by Keyence Corporation. The results are shown in Tables 4 to 6. When solder was accumulated on all of the electrodes, an evaluation of A was recorded, when absolutely no solder was accumulated on one or more electrodes, C was recorded, and when bridge formation between adjacent electrodes occurred in one or more locations, B was recorded. In the case of the substrate central region, one block of 22×22=484 electrodes was inspected, whereas in the case of the substrate periphery, the 21 electrodes along one edge of the outer periphery were inspected. Unless stated otherwise, inspections described below were performed in the same manner.

<Ease of Dissolution and Removal of Resin>

In order to confirm the presence or absence of solder residue and resin residue in the regions outside the electrode regions, each sample was inspected either visually or using the aforementioned digital microscope. The results are shown in Tables 4 to 6. When no solder residue or resin residue was observed, an evaluation of A was recorded, when residue having a size within a circle of diameter of 10 μm was observed at 1 to 3 sections, B was recorded, and when residue of the above size were observed at 4 or more sections, or residue having a size larger than the above size was observed at one or more sections, C was recorded.

<Fluctuation in Bump Height>

The height of the solder bumps was measured using a laser microscope (model number: 1LM21H) manufactured by Lasertec Corporation, or a non-contact shape measuring device (model number: YP10-T12) manufactured by Sony Precision Technology, Inc. The heights of 10 randomly selected bumps (or all of the bumps when the number of bumps was 10 or less) were measured, and the height fluctuation was calculated using a formula (2) shown below. In Tables 4 to 6, when the height fluctuation was 15% or less, an evaluation of A was recorded, when the height fluctuation exceeded 15% but was 35% or less, B was recorded, and when the height fluctuation exceeded 35%, C was recorded.

$$\text{Fluctuation in Bump Height} = \{(T\text{max} - T\text{min})/T\text{av}\} \times 100 \quad \text{Formula (2)}$$

Tmax represents the maximum value for the bump height, Tmin represents the minimum value for the bump height, and Tav represents the average value for the bump height.

<Voids Inside Bumps>

Voids inside the solder bumps were inspected using a Microfocus X-ray detection apparatus MF160C manufactured by Hitachi Kenki Finetech Co., Ltd. In X-ray transmission observation, a contrast image is generally obtained in which heavy elements are displayed as dark shades, and light elements are displayed as light shades. Accordingly, the solder bumps appear dark (black), and voids appear light (white). After formation of the bumps on the substrate, 10 randomly selected bumps (or all of the bumps when the number of bumps was 10 or less) were inspected by X-ray transmission. In Tables 4 to 6, when no voids were observed inside the bumps, an evaluation of A was recorded, when the number of bumps in which voids were observed was 1 or 2, B was recorded, and when the number of bumps in which voids were observed was 3 or more, C was recorded.

TABLE 4

| Example/Comparative Example | Electrode group | Workability | Solder self-assembly | Ease of dissolution and removal of resin | | Fluctuation in bump height | Voids inside bumps |
|---|---|---|---|---|---|---|---|
| | | | | Solvent | Evaluation | | |
| Example 1 | Substrate periphery | A | A | H$_2$O | A | A | A |
| | Substrate center | A | A | H$_2$O | A | A | A |
| Example 2 | Substrate periphery | A | A | H$_2$O | A | A | A |
| | Substrate center | A | A | H$_2$O | A | A | A |
| Example 3 | Substrate periphery | A | A | H$_2$O | A | A | A |
| | Substrate center | A | A | H$_2$O | A | A | A |
| Example 4 | Substrate periphery | A | A | MeOH/H$_2$O = 1/1 | A | A | A |
| | Substrate center | A | A | MeOH/H$_2$O = 1/1 | A | A | A |
| Example 5 | Substrate periphery | A | A | H$_2$O | A | A | A |
| | Substrate center | A | A | H$_2$O | A | A | A |

TABLE 4-continued

| Example/ Comparative Example | Electrode group | Solder self- Workability | assembly | Ease of dissolution and removal of resin Solvent | Evaluation | Fluctuation in bump height | Voids inside bumps |
|---|---|---|---|---|---|---|---|
| Example 6 | Substrate periphery | A | A | H$_2$O | A | A | A |
|  | Substrate center | A | A | H$_2$O | A | A | A |
| Example 7 | Substrate periphery | A | A | H$_2$O | A | A | A |
|  | Substrate center | A | A | H$_2$O | A | A | A |
| Example 8 | Substrate periphery | A | A | H$_2$O | A | A | A |
|  | Substrate center | A | A | H$_2$O | A | A | A |
| Comparative Example 1 | Substrate periphery | C | A | H$_2$O | C | A | C |
|  | Substrate center | C | A | H$_2$O | C | A | C |
| Comparative Example 2 | Substrate periphery | A | C | H$_2$O | C | C | A |
|  | Substrate center | A | C | H$_2$O | C | C | A |

TABLE 5

| Example/ Comparative Example | Electrode group | Solder self- Workability | assembly | Ease of dissolution and removal of resin Solvent | Evaluation | Fluctuation in bump height | Voids inside bumps |
|---|---|---|---|---|---|---|---|
| Example 9 | Substrate periphery | A | A | H$_2$O | A | A | A |
|  | Substrate center | A | A | H$_2$O | A | A | A |
| Example 10 | Substrate periphery | A | A | H$_2$O | A | A | A |
|  | Substrate center | A | A | H$_2$O | A | A | A |
| Example 11 | Substrate periphery | A | A | H$_2$O | A | A | A |
|  | Substrate center | A | A | H$_2$O | A | A | A |
| Example 12 | Substrate periphery | A | A | H$_2$O | A | A | A |
|  | Substrate center | A | A | H$_2$O | A | A | A |
| Example 13 | Substrate periphery | A | A | MeOH/H$_2$O = 1/1 | A | A | A |
|  | Substrate center | A | A | MeOH/H$_2$O = 1/1 | A | A | A |
| Example 14 | Substrate periphery | A | A | H$_2$O | A | A | A |
|  | Substrate center | A | A | H$_2$O | A | A | A |
| Example 15 | Substrate periphery | A | A | H$_2$O | A | A | A |
|  | Substrate center | A | A | H$_2$O | A | A | A |
| Example 16 | Substrate periphery | A | A | H$_2$O | A | A | A |
|  | Substrate center | A | A | H$_2$O | A | A | A |

TABLE 6

| Example/ Comparative Example | Electrode group | Solder self- Workability | assembly | Ease of dissolution and removal of resin Solvent | Evaluation | Fluctuation in bump height | Voids inside bumps |
|---|---|---|---|---|---|---|---|
| Example 17 | Substrate periphery | A | A | H$_2$O | A | A | A |
|  | Substrate center | A | A | H$_2$O | A | A | A |
| Example 18 | Substrate periphery | A | A | H$_2$O | A | A | A |
|  | Substrate center | A | A | H$_2$O | A | A | A |
| Example 19 | Substrate periphery | A | A | H$_2$O | A | A | A |
|  | Substrate center | A | A | H$_2$O | A | A | A |
| Example 20 | Substrate periphery | A | A | H$_2$O | A | A | A |
|  | Substrate center | A | A | H$_2$O | A | A | A |
| Example 21 | Substrate periphery | A | A | H$_2$O | A | A | A |
|  | Substrate center | A | A | H$_2$O | A | A | A |
| Example 22 | Substrate periphery | A | A | MeOH/H$_2$O = 1/1 | A | A | A |
|  | Substrate center | A | A | MeOH/H$_2$O = 1/1 | A | A | A |
| Example 23 | Substrate periphery | A | A | MeOH/H$_2$O = 1/1 | A | A | A |
|  | Substrate center | A | A | MeOH/H$_2$O = 1/1 | A | A | A |
| Example 24 | Substrate periphery | A | A | H$_2$O | A | A | A |
|  | Substrate center | A | A | H$_2$O | A | A | A |
| Example 25 | Substrate periphery | A | A | H$_2$O | A | A | A |
|  | Substrate center | A | A | H$_2$O | A | A | A |
| Example 26 | Substrate periphery | A | A | H$_2$O | A | A | A |
|  | Substrate center | A | A | H$_2$O | A | A | A |
| Example 27 | Substrate periphery | A | A | H$_2$O | A | A | A |
|  | Substrate center | A | A | H$_2$O | A | A | A |

In Example 1, a reflow film was prepared using a polyvinyl alcohol as the water-soluble resin used in the present invention, and Sn96.5Ag3Cu0.5 as lead-free solder particles. The reflow films of Examples 2 to 7 included a flux agent in addition to the above composition. In the case of Example 1, because the resin itself has a flux effect, the reflow film was formed using a polyvinyl alcohol. In Examples 2 and 3, the amount of the flux agent contained in the reflow film of Example 1 was altered. In Example 4, the water-soluble polyvinyl alcohol used as the resin in the reflow film of Example 2 was replaced with a low-saponification degree polyvinyl alcohol that was soluble in a mixed solvent composed of 1 part by mass of water and 1 part by mass of methanol. In Example 5, the polyvinyl alcohol used as the resin in the reflow film of Example 2 was replaced with a polyvinylpyrrolidone which was also water-soluble. In Example 6, the Sn96.5Ag3Cu0.5 used as the solder particles in the reflow film of Example 2 was replaced with solder particles of a smaller particle size. In Example 7, the Sn96.5Ag3Cu0.5 used as the solder particles in the reflow film of Example 2 was replaced with Sn42Bi58 having a low-melting temperature. In Example 8, the amount of the solder particles contained in the reflow film of Example 2 was increased. For each of Examples 1 to 8, favorable evaluation results were obtained for all the evaluations of workability, solder self-assembly, ease of dissolution and removal of the resin, fluctuation in the bump height, and voids inside the bumps.

Example 9 used a reflow film composed of a polyvinyl alcohol as the water-soluble resin used in the present invention, glycerol as the low-molecular weight component used in the second embodiment of the present invention, and Sn96.5Ag3Cu0.5 as the lead-free solder particles. The amount of glycerol used as the low-molecular weight component in Example 9 was 40 parts by mass with respect to 100 parts by mass of the polyvinyl alcohol, which satisfies the conditions of the second embodiment. The reflow films of Examples 10 to 16 included a flux agent in addition to the above composition. In the case of Example 9, the reflow film was formed using a polyvinyl alcohol which itself has a flux effect. In Examples 10 and 11, the amount of the flux agent contained in the reflow film of Example 9 was altered. In Example 12, the amount of the glycerol that is the low-molecular weight component of the reflow film of Example 11 was increased to 100 parts by mass. In Example 13, the polyvinyl alcohol of Example 11 was replaced with a low-saponification degree polyvinyl alcohol that was soluble in a mixed solvent composed of 1 part by mass of water and 1 part by mass of methanol. In Example 14, the Sn96.5Ag3Cu0.5 used as the solder particles in the reflow film of Example 11 was replaced with solder particles of a smaller particle size. In Example 15, the Sn96.5Ag3Cu0.5 used as the solder particles in the reflow film of Example 11 was replaced with Sn42Bi58 having a low-melting temperature. In Example 16, the amount of the solder particles contained in the reflow film of Example 11 was increased. For each of Examples 9 to 16, favorable evaluation results were obtained for all the evaluations of workability, solder self-assembly, ease of dissolution and removal of the resin, fluctuation in the bump height, and voids inside the bumps.

In Example 17, a reflow film was prepared using a polyvinyl alcohol as the water-soluble resin used in the present invention, and Sn96.5Ag3Cu0.5 as lead-free solder particles, so as to satisfy the polymerization degree conditions for the polyvinyl alcohol used in the third embodiment. The reflow films of Examples 18 to 27 contained a flux agent in addition to the above composition. In the case of Example 17, the reflow film was formed using a polyvinyl alcohol which itself has a flux effect. In Examples 19 to 23, the polyvinyl alcohol used in Example 18 was altered so that the polymerization degree and the saponification degree satisfied the conditions prescribed in the third embodiment. In Example 24, the amount of the flux agent was increased from the amount used in Example 18. In Examples 25 to 27, the size, composition (type) or amount of the solder used in Example 2 was altered. For each of Examples 17 to 27, favorable evaluation results were obtained for all the evaluations of workability, solder self-assembly, ease of dissolution and removal of the resin, fluctuation in the bump height, and voids inside the bumps.

In contrast, because Comparative Example 1 is a paste, the workability was poor, because it uses an epoxy resin that is a thermosetting resin, the dissolution and removal of the resin was poor, and because it included an added convection additive, voids were observed inside the bumps. Comparative Example 2 is a film based on an epoxy resin that is a thermosetting resin, and although the workability was superior to that of Comparative Example 1, in the heating step, the viscosity increased dramatically due to the addition of the acrylic rubber used in forming the film, and a resin network was also formed, and therefore the solder particles could not be accumulated on the electrodes. Moreover, because of curing of the thermosetting resin, the dissolution and removal of the resin by the solvent was poor, and because the self-assembly process was not completed, the fluctuation in the bump height was worse.

As described above, compared with the paste of Comparative Example 1 and the epoxy resin-based film of Comparative Example 2, when solder bumps were formed using the reflow films of Examples 1 to 27, the workability, the solder self-assembly, and the ease of dissolution and removal of the resin were excellent, and substrates with solder bumps were able to be produced in which the fluctuation in the bump height was minimal and the occurrence of voids inside the bumps was minimal

[Production of Semiconductor Device by Solder Joint Formation Between Opposing Electrodes]

<Mounting and Heating of Film or Paste>

By using the reflow film samples obtained in Examples 1 to 27, and the comparative samples of Comparative Examples 1 and 2, solder joints were formed between the opposing electrodes of two substrates. Three types of substrate combinations were used, namely a combination comprising an interposer beneath the reflow film and a semiconductor chip on top of the reflow film, a combination comprising semiconductor chips both above and beneath the reflow film, and a combination comprising interposers both above and beneath the reflow film.

In the case of the film-like samples of Examples 1 to 27 and Comparative Example 2, the film was cut to an appropriate size. The resulting film-like sample was used to form solder joints between the opposing electrodes via the following process: (1) the film was placed on the electrode surface side of a substrate comprising electrodes described below, and was fixed using a polyimide tape, (2) using a Flip Chip Bonder FCB3 manufactured by Panasonic Corporation and the substrate described below, the upper and lower electrodes were positioned in an opposing relationship, and the substrates were temporarily fixed. At this time, a polyimide film having a thickness of 50 μm was sandwiched between the substrates as a spacer. After temporary fixing, a bulldog clip was used to apply pressure and fix the substrates. (3) The substrates that was fixed with the aforementioned bulldog clip were then heated under a nitrogen atmosphere at a temperature of 260° C. for 1 minute, which is a temperature of melting the solder particles or higher and a temperature liquefying the resin film or higher. In the case of Example 7, Example 15 and Example 26 in which SnBi solder particles was used, only the heating temperature was altered, and heating was performed at 200° C.

Further, in the case of the paste-like sample of Comparative Example 1, an appropriate amount of the paste was dripped onto the electrode surface side of the substrate, the substrate that was to be connected was then placed on top, and a load was applied to compress and spread the paste. The remaining steps were performed in the same manner as described above for the film-like samples of Examples 1 to 27.

<Substrate (Interposer)>

The interposer used in forming the solder joints is as described above and illustrated in FIG. 1.

The film-like samples of Examples 1 to 27 and Comparative Example 2 were each mounted on the 4 blocks of the electrode group in the substrate central region (electrode diameter: 100 μm, pitch between electrodes: 200 μm). Further, the paste-like sample of Comparative Example 1 was similarly applied to the 4 blocks of the electrode group in the substrate central region.

<Substrate (Semiconductor Chip)>

Figure 3:
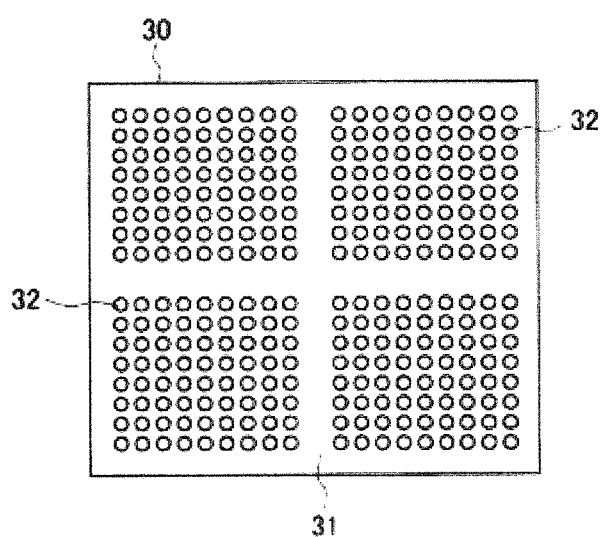
FIG. 3 is a schematic plan view of a semiconductor chip used in the examples and comparative examples.

A schematic plan view of the semiconductor chip that was used is illustrated in FIG. 3. The semiconductor chip 30 is produced for mounting in an opposing relationship to the 4 blocks of the electrodes 12b in the central region of the interposer. The chip is made of silicon, the chip size is 10 mm×10 mm×0.7 mm, and the electrodes 32 are arranged in 4 blocks in an area array. The electrodes of each block are composed of copper posts having a diameter of 96 μm and a height of 40 μm, and the pitch between electrodes is 200 μm. The number of electrodes in a single block is 22×22=484. Ina single chip, that is, across the 4 blocks, 484×4=1,936 electrodes were provided. The region 31 on the semiconductor chip upper surface outside of the electrodes (copper pillars) is composed of a polyimide that functions as a circuit protective layer for the silicon chip. Further, when semiconductor chips were stacked both above and beneath the reflow film, the electrodes of the semiconductor chip positioned beneath the reflow film were not copper posts, but rather a semiconductor chip having gold electrodes 51 such as those illustrated in FIG. 5 was used.

<Washing>

After the heating under a nitrogen atmosphere to effect self-assembly of the solder, each sample was immersed in distilled water that was heated to 80° C., and was washed for 10 minutes at 45 kHz using an ultrasonic washing device VS-100 Sunpar manufactured by Iuchi Co., Ltd. In Example 4, Example 13, Example 22 and Example 23, a mixed solvent of methanol/distilled water=1/1 (mass ratio) was used instead of the distilled water.

[Evaluation Methods]

Evaluations of the workability, the solder self-assembly, the ease of dissolution and removal of the resin, the presence of voids in the solder joint regions between the opposing electrodes, and the electrical conductivity of the semiconductor device are shown in Tables 7 to 9. Evaluation methods and evaluation criteria not specifically mentioned below were the same as the evaluations described for Tables 4 to 6.

<Solder Self-Assembly>

After the heating step (reflow) under a nitrogen atmosphere, the device was inspected by X-ray transmission using the aforementioned Microfocus X-ray detection apparatus MF160C to ascertain the level of self-assembly of the solder on the electrodes. The electrode regions and the regions outside the electrodes were compared relatively, and when all 484 electrodes appeared dark (because even electrodes on which solder has not accumulated appear dark, the existence of an even darker shade was used to ascertain the existence of solder accumulation) and the regions outside the electrodes appeared light, solder self-assembly was deemed to have occurred and an evaluation of A was recorded, when the above state was not achieved C was recorded, and when bridge formation between electrodes occurred in even one location (when the gap between the electrodes was joined with a dark color), B was recorded.

<Ease of Dissolution and Removal of Resin>

The presence or absence of solder residue and residual resin in the regions outside the electrodes was confirmed visually or by X-ray transmission using the aforementioned Microfocus X-ray detection apparatus MF160C.

Evaluation of the presence or absence of solder residue was performed by observation by X-ray transmission after dissolution and removal of the resin, and when no solder residue was observed, an evaluation of A was recorded, when residue having a size within a circle of diameter of 10 μm was observed at 1 to 3 sections, B was recorded, and when residue of the above size were observed at 4 or more sections, or residue having a size larger than the above size was observed at one or more sections, C was recorded. The results are shown in Tables 7 to 9.

Evaluation of the presence or absence of residual resin was performed by X-ray transmission observation and visual observation (or using a magnifying glass) before and after washing. In the X-ray transmission observation, when solder residue were confirmed at one or more sections prior to resin washing, and absolutely no solder residue was observed after the washing, the removal of the solder residue was assumed to indicate that the resin was also removed, and an evaluation of A was recorded, whereas when solder residue were confirmed at one or more sections even after washing, it was assumed that the resin was not also removed. When residue having a size within a circle of diameter of 10 μm was observed 1 to 3 sections even after washing, B was recorded, and when residue of the above size were observed at 4 or more sections, or residue having a size larger than the above size was observed at one or more sections, C was recorded.

Further, when the space between the substrates was inspected either visually or using a magnifying glass and absolutely no resin could be detected, an evaluation of A was recorded, when resin was confirmed at one section, B was recorded, and when resin were confirmed at two or more sections, C was recorded. The results are shown in Tables 7 to 9.

<Voids in Solder Joint Regions between Opposing Electrodes>

Voids inside the solder bumps were inspected using the aforementioned Microfocus X-ray detection apparatus MF160C. When no voids were observed in any of the 484 solder joint regions, an evaluation of A was recorded, when the number of bumps in which voids were observed was 1 or 2, B was recorded, and when the number of bumps in which voids were observed was 3 or more, C was recorded. The results are shown in Tables 7 to 9.

<Electrical Conductivity of Semiconductor Device>

In the electrode group of one block of the semiconductor device having solder joints formed by flip-chip connection, electrical resistance at a constant current of 1 mA was measured in a daisy chain circuit passing through all of the opposing electrodes (484 locations) by using an R6871E Digital Multimeter manufactured by Advantest Corporation and an ammeter Model 5964 manufactured by Mechatronics Co., Ltd. When the measured value was less than 17Ω, an evaluation of A was recorded, when the value was 17 to 19Ω, B was recorded, and when the value exceeded 19Ω, C was recorded. A daisy chain circuit has a configuration in which the upper and lower substrates appear to be stitched together with a thread, and is a circuit formed by repeating the configuration represented by [→lower substrate internal circuit→lower substrate electrode→solder joint region→opposing upper substrate electrode→upper substrate internal circuit→connected upper substrate electrode→solder joint region→opposing lower substrate electrode→lower substrate internal circuit→].

TABLE 7

| Example/Comparative Example | Upper substrate/lower substrate | Workability | Solder self-assembly | Solvent | Solder residue | Residual resin (X-ray transmission observation) | Residual resin (visual, magnifying glass) | Voids in solder joint regions | Electrical conductivity |
|---|---|---|---|---|---|---|---|---|---|
| Example 1 | a/b | A | A | H₂O | A | A | A | A | A |
|  | a/a | A | A | H₂O | A | A | A | A | A |
|  | b/b | A | A | H₂O | A | A | A | A | A |
| Example 2 | a/b | A | A | H₂O | A | A | A | A | A |
|  | a/a | A | A | H₂O | A | A | A | A | A |
|  | b/b | A | A | H₂O | A | A | A | A | A |
| Example 3 | a/b | A | A | H₂O | A | A | A | A | A |
|  | a/a | A | A | H₂O | A | A | A | A | A |
|  | b/b | A | A | H₂O | A | A | A | A | A |
| Example 4 | a/b | A | A | * | A | A | A | A | A |
|  | a/a | A | A | * | A | A | A | A | A |
|  | b/b | A | A | * | A | A | A | A | A |
| Example 5 | a/b | A | A | H₂O | A | A | A | A | A |
|  | a/a | A | A | H₂O | A | A | A | A | A |
|  | b/b | A | A | H₂O | A | A | A | A | A |
| Example 6 | a/b | A | A | H₂O | A | A | A | A | A |
|  | a/a | A | A | H₂O | A | A | A | A | A |
|  | b/b | A | A | H₂O | A | A | A | A | A |
| Example 7 | a/b | A | A | H₂O | A | A | A | A | A |
|  | a/a | A | A | H₂O | A | A | A | A | A |
|  | b/b | A | A | H₂O | A | A | A | A | A |
| Example 8 | a/b | A | A | H₂O | A | A | A | A | A |
|  | a/a | A | A | H₂O | A | A | A | A | A |
|  | b/b | A | A | H₂O | A | A | A | A | A |
| Comparative Example 1 | a/b | C | A | H₂O | C | C | C | C | C |
|  | a/a | C | A | H₂O | C | C | C | C | C |
|  | b/b | C | A | H₂O | C | C | C | C | C |
| Comparative Example 2 | a/b | A | C | H₂O | C | C | C | A | C |
|  | a/a | A | C | H₂O | C | C | C | A | C |
|  | b/b | A | C | H₂O | C | C | C | A | C | a: semiconductor chip,
b: interposer,
* MeOH/H₂O = 1/1

TABLE 8

| Example/Comparative Example | Upper substrate/lower substrate | Workability | Solder self-assembly | Solvent | Solder residue | Residual resin (X-ray transmission observation) | Residual resin (visual, magnifying glass) | Voids in solder joint regions | Electrical conductivity |
|---|---|---|---|---|---|---|---|---|---|
| Example 9 | a/b | A | A | H₂O | A | A | A | A | A |
|  | a/a | A | A | H₂O | A | A | A | A | A |
|  | b/b | A | A | H₂O | A | A | A | A | A |
| Example 10 | a/b | A | A | H₂O | A | A | A | A | A |
|  | a/a | A | A | H₂O | A | A | A | A | A |
|  | b/b | A | A | H₂O | A | A | A | A | A |
| Example 11 | a/b | A | A | H₂O | A | A | A | A | A |
|  | a/a | A | A | H₂O | A | A | A | A | A |
|  | b/b | A | A | H₂O | A | A | A | A | A |
| Example 12 | a/b | A | A | H₂O | A | A | A | A | A |
|  | a/a | A | A | H₂O | A | A | A | A | A |
|  | b/b | A | A | H₂O | A | A | A | A | A |
| Example 13 | a/b | A | A | * | A | A | A | A | A |
|  | a/a | A | A | * | A | A | A | A | A |
|  | b/b | A | A | * | A | A | A | A | A |

TABLE 8-continued

Ease of dissolution and removal of resin

| Example/ Comparative Example | Upper substrate/ lower substrate | Work- ability | Solder self- assembly | Solvent | Solder residue | Residual resin (X-ray transmission observation) | Residual resin (visual, magnifying glass) | Voids in solder joint regions | Electrical conductivity |
|---|---|---|---|---|---|---|---|---|---|
| Example 14 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 15 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 16 | a/b | A | A | $H_2O$ | A | A | A | A | A |
|  | a/a | A | A | $H_2O$ | A | A | A | A | A |
|  | b/b | A | A | $H_2O$ | A | A | A | A | A | a: semiconductor chip,
b: interposer,
* MeOH/$H_2O$ = 1/1

TABLE 9

Ease of dissolution and removal of resin

| Example/ Comparative Example | Upper substrate/ lower substrate | Work- ability | Solder self- assembly | Solvent | Solder residue | Residual resin (X-ray transmission observation) | Residual resin (visual, magnifying glass) | Voids in solder joint regions | Electrical conductivity |
|---|---|---|---|---|---|---|---|---|---|
| Example 17 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 18 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 19 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 20 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 21 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 22 | a/b | A | A | * | A | A | A | A | A |
|  | a/a | A | A | * | A | A | A | A | A |
|  | b/b | A | A | * | A | A | A | A | A |
| Example 23 | a/b | A | A | * | A | A | A | A | A |
|  | a/a | A | A | * | A | A | A | A | A |
|  | b/b | A | A | * | A | A | A | A | A |
| Example 24 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 25 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 26 | a/b | A | A | $H_2O$ | A | A | A | A | A |
|  | a/a | A | A | $H_2O$ | A | A | A | A | A |
|  | b/b | A | A | $H_2O$ | A | A | A | A | A |
| Example 27 | a/b | A | A | $H_2O$ | A | A | A | A | A |
|  | a/a | A | A | $H_2O$ | A | A | A | A | A |
|  | b/b | A | A | $H_2O$ | A | A | A | A | A | a: semiconductor chip,
b: interposer,
* MeOH/$H_2O$ = 1/1

In Tables 7 to 9, "a" denotes a semiconductor chip, "b" denotes an interposer, and "*" denotes MeOH/$H_2O$=1/1.

For each of Examples 1 to 27, favorable evaluation results were obtained for all the evaluations of workability, solder self-assembly, ease of dissolution and removal of the resin, voids inside the solder joint regions, and electrical resistance.

Because Comparative Example 1 is a paste, the workability was poor, because it uses an epoxy resin that is a thermosetting resin, the dissolution and removal of the resin was poor, and because it contained an added convection additive, voids were observed in the solder joint regions. Further, because the solder joint regions contained the epoxy resin, the electrical resistance was high. Comparative Example 2 is a film based on an epoxy resin that is a thermosetting resin, and although the workability was superior to that of Comparative Example 1, in the heating step, the viscosity increased dramatically due to the addition of the acrylic rubber used in forming the film, and a resin network was also formed, and therefore the solder particles could not be accumulated on the electrodes. The self-assembly process was not completed, the electrical resistance was high, and electrical conduction could not be achieved. Moreover, curing of the thermosetting resin meant that the dissolution and removal of the resin by the solvent was poor.

As described above, compared with the paste of Comparative Example 1 and the epoxy resin-based film of Comparative Example 2, when solder joints were formed between the opposing electrodes using the reflow films of Examples 1 to 27, the workability, the solder self-assembly, and the ease of dissolution and removal of the resin were excellent, and solder joint regions and semiconductor devices having low electrical resistance and in which the occurrence of voids in the joint regions was minimal were able to be produced.

[Preparation of Substrate with Solder Bumps]

Each of the substrates with solder bumps of Examples 1 to 8 obtained upon performing the final <Washing> in the aforementioned [Solder Bump Formation] was subsequently dried for 4 hours at 120° C., thus obtaining an interposer with solder bumps or a semiconductor chip with solder bumps.

<Solder Bump Formation Using Solder Paste of Comparative Example>

An appropriate amount of the solder paste prepared in the aforementioned Comparative Example 1 was dripped onto the electrode surface of the substrate (semiconductor chip or interposer), thereby forming an interposer with solder bumps or semiconductor chip with solder bumps (9).

[Production of Semiconductor Device using Substrate with Solder Bumps]

Semiconductor devices were produced using the interposer with solder bumps or the semiconductor chip with solder bumps (1 to 9) obtained above. Four types of substrate combinations were used, namely a combination comprising an interposer with bumps and a semiconductor chip, a combination comprising a semiconductor chip with bumps and an interposer, a combination comprising a semiconductor chip with bumps and a semiconductor chip, and a combination comprising an interposer with bumps and an interposer. Two patterns exist for each of these combinations, namely a pattern in which the substrate with bumps is above and the other substrate electrodes are below, and a pattern in which the substrate electrodes are above and the substrate with bumps is below, and therefore considering the upper and lower positioning of the substrates, a total of 8 patterns exist.

The solder bumps of the substrate with bumps, and the substrate for connection to the substrate with bumps were prepared, a methanol solution of salicylic acid was applied to the solder bumps of the former substrate, and by using a Flip Chip Bonder FCB3 manufactured by Panasonic Corporation, the electrodes of the upper and lower substrates were positioned in an opposing relationship, and the substrates were temporarily fixed. The substrates that are temporarily fixed with the aforementioned Flip Chip Bonder were subjected to reflow under a nitrogen atmosphere by heating at a temperature of 260° C. for one minute, which is a temperature of melting the solder bumps or higher. However, in the case of the substrate of Example 7 which used SnBi solder particles, only the reflow temperature was altered, and heating was performed at 200° C.

<Interposer>

The interposer that was used was the interposer described above and illustrated in FIG. 1. When preparing the interposer with bumps, the film-like samples of Examples 1 to 8 were each mounted on the 4 blocks of the electrode group in the substrate central region (electrode diameter: 100 μm, pitch between electrodes: 200 μm). Further, the paste-like sample of Comparative Example 1 was similarly applied to the 4 blocks of electrodes in the substrate central region.

<Semiconductor Chip>

The semiconductor chip that was used was the semiconductor chip described above and illustrated in FIG. 3. When the semiconductor chip was positioned beneath during the mounting process, the electrodes of the semiconductor chip were not copper posts, but rather a semiconductor chip having gold electrodes 51 was used.

When preparing the semiconductor chip with bumps, the film-like samples of Examples 1 to 8 were each mounted on the 4 blocks of the electrodes 32 in the substrate central region (electrode diameter: 96 μm, pitch between electrodes: 200 μm). Further, the paste-like sample of Comparative Example 1 was similarly applied to the 4 blocks of electrodes 32 in the substrate central region.

[Evaluation Methods]

<Workability in Step of Preparing Substrate with Bumps>

Evaluations of the workability are shown in Tables 10 and 11. In the evaluation of the workability of the substrate on which the bumps were to be formed, the film-like or paste-like sample was mounted or applied to a substrate 10 times, and the fluctuation in the amount mounted or the amount applied was calculated using the formula (1) mentioned above. When the fluctuation was less than 20%, an evaluation of A was recorded, when the fluctuation was more than 20% but less than 35%, B was recorded, and when the fluctuation was 35% or more, C was recorded. The larger the fluctuation in the mounted or applied mass, the more frequently the amount mounted or the amount applied must be adjusted, resulting in deterioration in the workability.

<Fluctuation in Bump Height on Substrate with Bumps>

The height of the solder bumps was measured using the aforementioned laser microscope (model number: 1LM21H) manufactured by Lasertec Corporation, or the aforementioned non-contact shape measuring device (model number: YP10-T12) manufactured by Sony Precision Technology, Inc. The heights of 10 randomly selected bumps (or all of the bumps when the number of bumps was 10 or less) were measured, and the height fluctuation was calculated using the formula (2) mentioned above. In Tables 10 and 11, when the height fluctuation was 15% or less, an evaluation of A was recorded, when the height fluctuation exceeded 15% but was 35% or less, B was recorded, and when the height fluctuation exceeded 35%, C was recorded.

<Voids in Solder Joint Regions between Opposing Electrodes of Semiconductor Device>

Voids inside the solder bumps were inspected using the aforementioned Microfocus X-ray detection apparatus MF160C. When no voids were observed in all 484 solder joint regions, an evaluation of A was recorded, when the number of bumps in which voids were observed was 1 or 2, B was recorded, and when the number of bumps in which voids were observed was 3 or more, C was recorded. The results are shown in Tables 10 and 11.

<Electrical Conductivity of Semiconductor Device>

In the electrode group of one block of the semiconductor device having solder joints formed by flip-chip connection, electrical resistance was measured under the same conditions as the electrical resistance measurement described above in a daisy chain circuit passing through all of the opposing electrodes (484 locations). When the measured value was less than 17Ω, an evaluation of A was recorded, when the value was 17 to 19Ω, B was recorded, and when the value exceeded 19Ω, C was recorded.

TABLE 8

| Example/ Comparative Example | Bump formation substrate | Upper substrate/ lower substrate | Workability | Fluctuation in solder bump height | Voids in solder joint regions | Electrical conductivity |
|---|---|---|---|---|---|---|
| Example 1 | Semiconductor chip | A/b | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |
| Example 2 | Semiconductor chip | A/b | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |
| Example 3 | Semiconductor chip | A/b | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |
| Example 4 | Semiconductor chip | A/b | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |

In the above column labeled "upper substrate/lower substrate",
"A" denotes a semiconductor chip with bumps,
"B" denotes an interposer with bumps,
"a" denotes a semiconductor chip, and
"b" denotes an interposer.

TABLE 11

| Example/ Comparative Example | Bump formation substrate | Upper substrate/ lower substrate | Workability | Fluctuation in solder bump height | Voids in solder joint regions | Electrical conductivity |
|---|---|---|---|---|---|---|
| Example 5 | Semiconductor chip | A/b | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |
| Example 6 | Semiconductor chip | A/b | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |
| Example 7 | Semiconductor chip | A/a | A | A | A | A |
| | | b/A | A | A | A | A |
| | | A/a | A | A | A | A |
| | | a/A | A | A | A | A |

TABLE 11-continued

| Example/ Comparative Example | Bump formation substrate | Upper substrate/ lower substrate | Workability | Fluctuation in solder bump height | Voids in solder joint regions | Electrical conductivity |
|---|---|---|---|---|---|---|
| | Interposer | B/a | A | A | A | A |
| | | a/B | A | A | A | A |
| | | B/b | A | A | A | A |
| | | b/B | A | A | A | A |
| Example 8 | Semiconductor chip | A/a | A | A | A | A |
| | | b/A | A | A | A | A |
| | | A/a | A | A | A | A |
| | | a/A | A | A | A | A |
| | Interposer | B/a | A | A | A | A |
| | | a/B | A | A | A | A |
| | | B/b | A | A | A | A |
| | | b/B | A | A | A | A |
| Comparative Example 1 | Semiconductor chip | A/a | C | C | C | C |
| | | b/A | C | C | C | C |
| | | A/a | C | C | C | C |
| | | a/A | C | C | C | C |
| | Interposer | B/a | C | C | C | C |
| | | a/B | C | C | C | C |
| | | B/b | C | C | C | C |
| | | b/B | C | C | C | C |

In the above column labeled "upper substrate/lower substrate",
"A" denotes a semiconductor chip with bumps,
"B" denotes an interposer with bumps,
"a" denotes a semiconductor chip, and
"b" denotes an interposer.

For each of Examples 1 to 8, favorable evaluation results were obtained for all the evaluations of workability, fluctuation in solder bump height, voids in the solder joint regions, and electrical resistance.

In contrast, because Comparative Example 1 is a paste, the workability was poor, and there was fluctuation in the height of the formed solder bumps. Further, because Comparative Example 1 contained an added convection additive, voids were observed in the solder joint regions. Moreover, because the solder joint regions contained the epoxy resin, the electrical resistance was high.

As described above, when substrates with solder bumps are prepared using the reflow films of Examples 1 to 8, and solder joints are then formed by these substrates with solder bumps, the workability is superior to that of the paste of Comparative Example 1, and solder joint regions and semiconductor devices having minimal voids in the solder joint regions and low electrical resistance can be produced.

REFERENCE SIGNS LIST

10: Substrate (Interposer)
11: Region outside of electrodes on substrate upper surface (solder resist)
12: Electrode
12a: Electrode (group) around the substrate periphery
12b: Electrode (group) in the substrate central region
21: Reflow film
22: Eagle glass plate (flat plate)
23: Solder bump
24: Reflow film containing solder residue
30: Semiconductor chip
31: Region outside of electrodes (copper pillars) on semiconductor chip upper surface (polyimide)
32: Electrode (copper pillar) of semiconductor chip
43: Solder joint region formed between opposing electrodes
51: Electrode (gold) of semiconductor chip
81: Solder joint region

The invention claimed is:

1. A reflow film comprising a polyvinyl alcohol having an average polymerization degree from 100 to 1,000 which is dissolvable in a solvent, solder particles, wherein the solder particles are dispersed in the film, and a low-molecular weight alcohol having a boiling point of 100° C. or higher, a molecular weight of 500 or less, and which dissolves or disperses in water, in an amount of 20 to 300 parts by mass with respect to 100 parts by mass of the polyvinyl alcohol.

2. The reflow film according to claim 1, wherein the solvent is water, an alcohol, or a mixture thereof.

3. The reflow film according to claim 1, wherein a saponification degree of the polyvinyl alcohol is from 28 to 98 mol %.

4. The reflow film according to claim 1, wherein the low-molecular weight alcohol is glycerol.

5. The reflow film according to claim 1, further comprising a component for removing a metal oxide.

6. The reflow film according to claim 1, wherein in a cumulative particle size distribution of the solder particles, a particle size at a cumulative value of 10% from a fine particle end of the distribution and a particle size at a cumulative value of 90% are both within a range from 1 to 50 μm.

7. The reflow film according to claim 1, wherein the solder particles are formed from a lead-free solder.

8. The reflow film according to claim 1, wherein the solder particles are formed from an alloy of tin, silver and copper.

9. The reflow film according to claim 1, which comprises 30 to 500 parts by mass of the solder particles with respect to 100 parts by mass of the polyvinyl alcohol.

10. A solder bump formation method which uses the reflow film according to claim 1, comprising:
(A) a step of mounting the reflow film on an electrode surface side of a substrate comprising electrodes,
(B) a step of mounting and fixing a flat plate to the reflow film, (C) a step of heating at a temperature of melting the solder particles in the reflow film or higher, and at a temperature of liquefying the polyvinyl alcohol and the low-molecular weight alcohol having a boiling point of 100° C. or higher, a molecular weight of 500 or less, and which dissolves or disperses in water or higher, and (D) a step of dissolving and removing the reflow film after completion of the step (C).

11. The solder bump formation method according to claim 10, wherein the step (C) is performed under an inert gas atmosphere.

12. The solder bump formation method according to claim 10, wherein the step (C) is performed in a state where pressure is applied from the flat plate toward the substrate.

13. The solder bump formation method according to claim 10, wherein in the step (D), the reflow film comprising residual solder particles that exists in regions outside the electrode surfaces is removed by water, an alcohol, or a mixed solvent thereof.

14. The solder bump formation method according to claim 10, wherein in the step (D), ultrasonic waves are irradiated.

15. A solder joint formation method which uses a substrate with solder bumps prepared by forming bumps on electrodes of a substrate using the solder bump formation method according to claim 10, comprising:

(E) a step of applying a component for removing metal compounds to at least one of the solder bumps of the substrate with solder bumps, and electrodes of another substrate comprising electrodes which is to be connected to the substrate with solder bumps, (F) a step of either mounting an electrode surface side of the other substrate on the solder bumps of the substrate with solder bumps, or mounting the solder bumps side of the substrate with solder bumps on the electrodes of the other substrate, so that electrodes of the upper and lower substrates oppose one another, and (G) a step of heating, in an opposing state described above in (F), at a temperature of melting the solder bumps or higher.

16. A solder joint region, formed between opposing electrodes of two substrates comprising electrodes using the solder joint formation method according to claim 15.

17. A semiconductor device, having the solder joint region according to claim 16, wherein a combination of the substrates comprising electrodes is a combination of a semiconductor chip and an interposer, a semiconductor chip and a semiconductor chip, or an interposer and an interposer.

18. The solder joint formation method according to claim 15, wherein the step (G) is performed in a state where pressure is applied to the mounted substrate.

19. A solder bump formed using the solder bump formation method according to claim 10.

20. The solder bump according to claim 19, wherein the substrate is a semiconductor chip or an interposer.

21. A substrate with solder bumps prepared by forming bumps on the electrodes of a substrate using the solder bump formation method according to claim 10.

22. The substrate with solder bumps according to claim 21, wherein the substrate is a semiconductor chip or an interposer.

23. A solder joint formation method which uses the reflow film according to claim 1, comprising:

(a) a step of mounting the reflow film on an electrode surface side of a substrate comprising electrodes, (b) a step of mounting an electrode surface side of another substrate comprising electrodes on the reflow film, and fixing the substrates in positions where the electrodes of the upper and lower substrates oppose one another across the reflow film, (c) a step of heating, in a state described above in (b), at a temperature of melting the solder particles in the reflow film or higher, and at a temperature of liquefying the polyvinyl alcohol and the low-molecular weight alcohol having a boiling point of 100° C. or higher, a molecular weight of 500 or less, and which dissolves or disperses in water or higher, and (d) a step of dissolving and removing the reflow film after completion of the step (c).

24. The solder joint formation method according to claim 23, wherein the step (c) is performed under an inert gas atmosphere.

25. The solder joint formation method according to claim 23, wherein the step (c) is performed in a state where pressure is applied to the mounted substrate.

26. The solder joint formation method according to claim 23, wherein in the step (d), the reflow film comprising residual solder particles that exists in regions outside regions between the opposing electrodes is removed by water, an alcohol, or a mixed solvent thereof.

27. The solder joint formation method according to claim 23, wherein in the step (d), ultrasonic waves are irradiated.

28. A solder joint region, formed between opposing electrodes of two substrates comprising electrodes using the solder joint formation method according to claim 23.

29. A semiconductor device, having the solder joint region according to claim 28, wherein a combination of the substrates comprising electrodes is a combination of a semiconductor chip and an interposer, a semiconductor chip and a semiconductor chip, or an interposer and an interposer.

30. The reflow film according to claim 1, wherein the amount of the low-molecular weight alcohol is from 20 to 200 parts by mass with respect to 100 parts by mass of the polyvinyl alcohol.

31. The reflow film according to claim 1, wherein the amount of the low-molecular weight alcohol is from 30 to 100 parts by mass with respect to 100 parts by mass of the polyvinyl alcohol.

32. A reflow film consisting essentially of:

a polyvinyl alcohol having an average polymerization degree from 100 to 1,000 which is dissolvable in a solvent, solder particles, wherein the solder particles are dispersed in the film, and a low-molecular weight alcohol having a boiling point of 100° C. or higher, a molecular weight of 500 or less, and which dissolves or disperses in water, in an amount of 20 to 300 parts by mass with respect to 100 parts by mass of the polyvinyl alcohol.

* * * * *